(12) United States Patent
Ikari et al.

(10) Patent No.: US 10,854,821 B2
(45) Date of Patent: Dec. 1, 2020

(54) ORGANIC LIGHT EMITTING DEVICE

(71) Applicant: CANON KABUSHIKI KAISHA, Tokyo (JP)

(72) Inventors: Kenichi Ikari, Abiko (JP); Hiroki Ohrui, Kawasaki (JP); Yojiro Matsuda, Kawasaki (JP); Haruna Iida, Nagoya (JP); Masumi Itabashi, Kodaira (JP); Kei Tagami, Yokohama (JP); Tetsuo Takahashi, Kawasaki (JP); Satoru Shiobara, Funabashi (JP); Tomona Yamaguchi, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 436 days.

(21) Appl. No.: 14/787,800

(22) PCT Filed: Apr. 25, 2014

(86) PCT No.: PCT/JP2014/062210
§ 371 (c)(1),
(2) Date: Oct. 29, 2015

(87) PCT Pub. No.: WO2014/178441
PCT Pub. Date: Nov. 6, 2014

(65) Prior Publication Data
US 2016/0093809 A1    Mar. 31, 2016

(30) Foreign Application Priority Data

Apr. 30, 2013 (JP) .................................. 2013-095550
Jan. 10, 2014 (JP) .................................. 2014-002872

(51) Int. Cl.
*H01L 51/50* (2006.01)
*H01L 51/00* (2006.01)
(Continued)

(52) U.S. Cl.
CPC ........ *H01L 51/0058* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS 6,661,023 B2 * 12/2003 Hoag .................... C09K 11/06
257/40
7,528,542 B2    5/2009 Kawamura et al.
(Continued)

FOREIGN PATENT DOCUMENTS

JP    2006-156888 A    6/2006
JP    2007-59903 A    3/2007
(Continued)

OTHER PUBLICATIONS

Tianshi Qin et al., "Core, Shell, and Surface-Optimized Dendrimers for Blue Light-Emitting Diodes," J. of Am. Chem. Soc., vol. 133, pp. 1301-1303 (2011).
(Continued)

*Primary Examiner* — Gregory D Clark
(74) *Attorney, Agent, or Firm* — Venable LLP

(57) ABSTRACT

Provided is an organic light emitting device having high emission efficiency and a long continuous driving lifetime. The organic light emitting device includes: an anode; a cathode; and an emitting layer placed between the anode and the cathode, in which: the emitting layer contains an emitting material that emits fluorescence; and in an emission wavelength region of the emitting material, an absorption peak of an absorption spectrum in a minimum excited triplet
(Continued)

state of a material having a smallest minimum excited triplet energy out of constituent materials in the emitting layer is absent.

19 Claims, 4 Drawing Sheets

(51) Int. Cl.
 C09K 11/06 (2006.01)
 C09K 11/02 (2006.01)
 G03G 15/04 (2006.01)
 H01L 27/32 (2006.01)
(52) U.S. Cl.
 CPC ... *G03G 15/04054* (2013.01); *H01L 27/3244* (2013.01); *H01L 51/008* (2013.01); *H01L 51/0054* (2013.01); *H01L 51/0056* (2013.01); *H01L 51/5004* (2013.01); *H01L 51/5016* (2013.01); *C09K 2211/1007* (2013.01); *C09K 2211/1011* (2013.01); *C09K 2211/1022* (2013.01); *C09K 2211/1029* (2013.01); *H01L 51/0059* (2013.01); *H01L 51/0072* (2013.01); *H01L 51/5036* (2013.01)

(56) References Cited

U.S. PATENT DOCUMENTS

| | | | |
|---|---|---|---|
| 7,645,525 B2 | 1/2010 | Aziz et al. | |
| 7,763,761 B2 | 7/2010 | Kubota et al. | |
| 7,794,856 B2 | 9/2010 | Shiobara et al. | |
| 7,928,650 B2 | 4/2011 | Mori et al. | |
| 8,007,925 B2 | 8/2011 | Watanabe et al. | |
| 8,072,137 B2 | 12/2011 | Ohrui et al. | |
| 8,076,681 B2 | 12/2011 | Mori et al. | |
| 8,076,841 B2 | 12/2011 | Shiobara et al. | |
| 2006/0154107 A1 | 7/2006 | Kubota et al. | |
| 2006/0158102 A1 | 7/2006 | Kawamura et al. | |
| 2007/0087220 A1 | 4/2007 | Alvarado et al. | |
| 2007/0097040 A1* | 5/2007 | Miyazawa | G06K 15/1209 345/77 |
| 2007/0145886 A1 | 6/2007 | Aziz et al. | |
| 2007/0228999 A1* | 10/2007 | Kit | H05B 33/0803 315/291 |
| 2008/0220289 A1 | 9/2008 | Shioya et al. | |
| 2009/0066227 A1 | 3/2009 | Okinaka et al. | |
| 2009/0162091 A1* | 6/2009 | Yokoi | G03G 15/04054 399/90 |
| 2009/0169921 A1* | 7/2009 | Cheng | C07C 15/38 428/690 |
| 2010/0090209 A1 | 4/2010 | Ikari et al. | |
| 2010/0276671 A1* | 11/2010 | Sarma | H01L 27/3262 257/40 |
| 2010/0295444 A1 | 11/2010 | Kuma et al. | |
| 2010/0308718 A1 | 12/2010 | Kubota et al. | |
| 2011/0001864 A1 | 1/2011 | Okinaka et al. | |
| 2013/0248850 A1* | 9/2013 | Choi | H01L 29/66969 257/43 |
| 2016/0133846 A1 | 5/2016 | Ishii et al. | |
| 2016/0301633 A1* | 10/2016 | Killoran, Jr. | G06F 16/955 |
| 2018/0301633 A1* | 10/2018 | Ishii | C09K 11/06 |

FOREIGN PATENT DOCUMENTS

| | | |
|---|---|---|
| JP | 2007-180558 A | 7/2007 |
| JP | 2011-66446 A | 3/2011 |
| JP | 2012-99593 A | 5/2012 |
| WO | 2007/072741 A1 | 6/2007 |
| WO | 2009/139501 A1 | 11/2009 |
| WO | 2010/134350 A1 | 11/2010 |

OTHER PUBLICATIONS

R. R Ahlrichs, et al., "Electronic Structure Calculations on Workstation Computers: The Program System Turbomole," Chem. Phys. Lett., vol. 162, No. 3, pp. 165-169 (1989).

* cited by examiner

ORGANIC LIGHT EMITTING DEVICE

TECHNICAL FIELD

The present invention relates to an organic light emitting device (an organic electroluminescence device, an organic EL device).

BACKGROUND ART

An organic light emitting device is an electronic device including an anode, a cathode, and an organic compound layer placed between the anode and the cathode. An exciton of a luminous organic compound in the organic compound layer is produced by injecting an electron and a hole from the respective electrodes, and the organic light emitting device emits light when the exciton returns to its ground state.

Recent progress of the organic light emitting device is remarkable, and the characteristics of the device enable, for example, a light emitting device with a high luminance at a low applied voltage, a variety of emission wavelengths, high-speed responsiveness, thin shape, and light weight.

At present, however, the emission efficiency and continuous driving lifetime of the organic light emitting device are not sufficient for the device to be put into practical use as a light emitting device such as a display, and hence light emission with additionally high efficiency and the improvement of the continuous driving lifetime have been required.

With regard to the improvement of the continuous driving lifetime of the organic light emitting device, Patent Literature 1 discloses an organic light emitting device whose emitting layer contains a stabilizing material. The term "stabilizing material" as used in Patent Literature 1 means a material having an energy band gap larger than the energy band gap of an emitting material. In the organic light emitting device disclosed in Patent Literature 1, a high-energy exciton produced in an active host material by an interaction between excitation energy states is deactivated by the stabilizing material as a stabilizer, and hence the deterioration of the material is suppressed.

In addition, Patent Literature 2 discloses an organic light emitting device including a region (emitting zone) containing a material that reduces an interaction between excitons. It should be noted that the interaction between the excitons to be reduced in Patent Literature 2 is at least one of a triplet-triplet interaction, a triplet-singlet interaction, and a singlet-singlet interaction. In addition, Patent Literature 2 describes, as specific measures to reduce the interaction, the addition of a triplet quenching material, the addition of a material having a strong spin-orbit coupling characteristic, the addition of a material having a strong absorption characteristic for a high-order excitation energy level, the lengthening of an intermolecular distance, and the application of a magnetic field.

Further, Patent Literature 3 describes a device characterized in that a hole trapping dopant and an electron trapping dopant are caused to coexist in its emitting layer.

Meanwhile, various proposals for the improvement of the emission efficiency have been made from the viewpoints of a material, a device construction, and the like. Patent Literature 4 discloses a pyrene skeleton material that can be used as a constituent material for an organic light emitting device.

CITATION LIST

Patent Literature

PTL 1: Japanese Patent Application Laid-Open No. 2007-59903

PTL 2: Japanese Patent Application Laid-Open No. 2007-180558

PTL 3: Japanese Patent Application Laid-Open No. 2006-156888

PTL 4: Japanese Patent Application Laid-Open No. 2011-66446

SUMMARY OF INVENTION

Technical Problem

The present invention has been made to solve the problems, and an object of the present invention is to provide an organic light emitting device having high emission efficiency and a long continuous driving lifetime.

Solution to Problem

An organic light emitting device according to one embodiment of the present invention includes: an anode; a cathode; and an emitting layer placed between the anode and the cathode, in which: the emitting layer contains an emitting material that emits fluorescence; and in an emission wavelength region of the emitting material, an absorption peak of an absorption spectrum in a minimum excited triplet state of a material having a smallest minimum excited triplet energy out of constituent materials in the emitting layer is absent.

Further features of the present invention will become apparent from the following description of exemplary embodiments with reference to the attached drawings.

Figure 1:
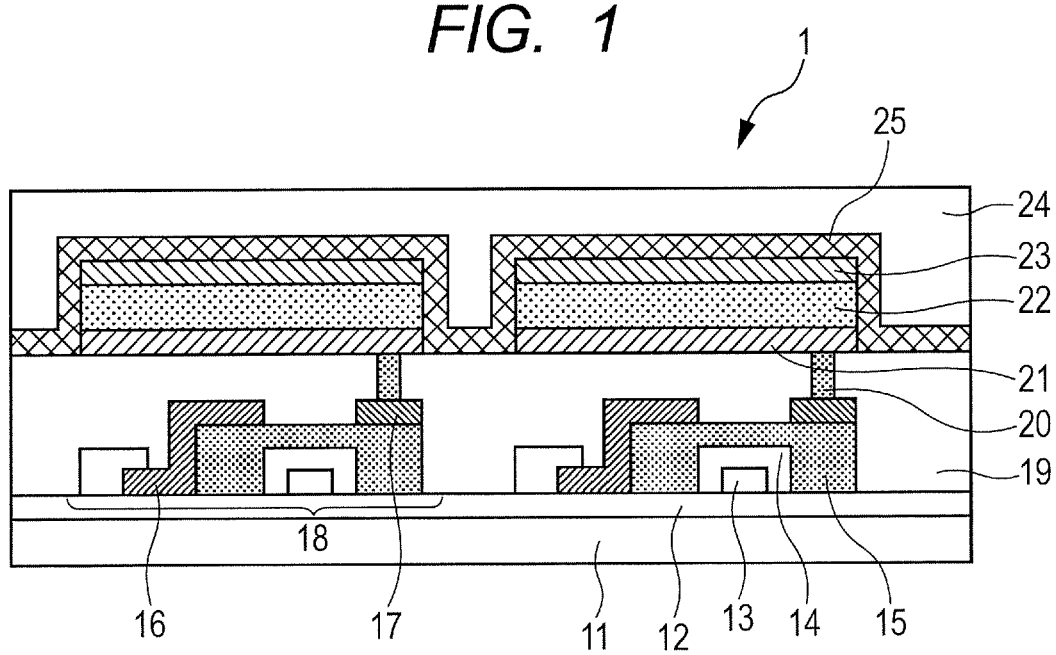
FIG. 1 is a schematic sectional view illustrating an example of a display apparatus including an organic light emitting device of the present invention and an active device connected to the organic light emitting device.

DESCRIPTION OF EMBODIMENTS (1) Organic Light Emitting Device

First, an organic light emitting device of the present invention is described. The organic light emitting device of the present invention includes: an anode; a cathode; and an emitting layer placed between the anode and the cathode. In the present invention, the emitting layer contains an emitting material that emits fluorescence. In addition, in the present invention, in an emission wavelength region of the emitting material, an absorption peak of an absorption spectrum in a minimum excited triplet state of a material having the smallest minimum excited triplet energy out of constituent materials in the emitting layer is absent. Here, the phrase "an absorption peak of an absorption spectrum is absent" means that the absorption spectrum does not have any absorption peak in the emission wavelength region of the emitting material.

For example, the following constructions (A) to (E) are given as a specific construction of the organic light emitting device of the present invention.
(A) (Substrate/)anode/hole transporting layer/emitting layer/electron transporting layer/cathode
(B) (Substrate/)anode/hole injection layer/hole transporting layer/emitting layer/electron transporting layer/cathode
(C) (Substrate/)anode/hole injection layer/hole transporting layer/emitting layer/electron transporting layer/electron injection layer/cathode
(D) (Substrate/)anode/hole injection layer/hole transporting layer/emitting layer/hole blocking layer/electron transporting layer/cathode
(E) (Substrate/)anode/hole injection layer/hole transporting layer/emitting layer/hole blocking layer/electron transporting layer/electron injection layer/cathode It should be noted that the constructions described in the (A) to (E) are each merely an embodiment of the present invention and the construction of the organic light emitting device of the present invention is not limited thereto. Various layer constructions can be adopted; for example, an insulating layer, an adhesion layer, or an interference layer may be provided at an interface between an electrode and the organic compound layer.

Out of the constituent materials for the emitting layer, a material having the largest weight ratio with respect to the entirety of the emitting layer is a host. In addition, out of the constituent materials for the emitting layer, a material having a weight ratio with respect to the entirety of the emitting layer smaller than that of the host and mainly responsible for light emission is a luminous dopant. In addition, in the present invention, a material that has a weight ratio smaller than that of the host and assists the light emission of the luminous dopant may be incorporated into the emitting layer as a constituent material for the emitting layer. The material that assists the light emission of the luminous dopant as described above is a material called an assist material or a second host.

In the present invention, the inventors have attempted to develop a device that improves in continuous driving durability with an approach different from a conventional technology. The approach specifically involves analyzing a path that causes the deterioration of the device and attempting to alleviate a phenomenon or process due to leading the device to the path.

In the present invention, the inventors have first noticed a phenomenon described below. The phenomenon is that when a compound in the minimum triplet excited state has an absorption peak in the wavelength region of light emitted from an emitting layer, the compound deteriorates.

Described below is an experiment for verifying the phenomenon in which the deterioration of the material is caused by further exciting the compound in the minimum triplet excited state with the light emitted from the emitting layer.

(1) Production of Sample for Verification Experiment

First, compounds listed below were each prepared. It should be noted that each of the compounds listed below is a compound serving as a sample for the verification experiment.

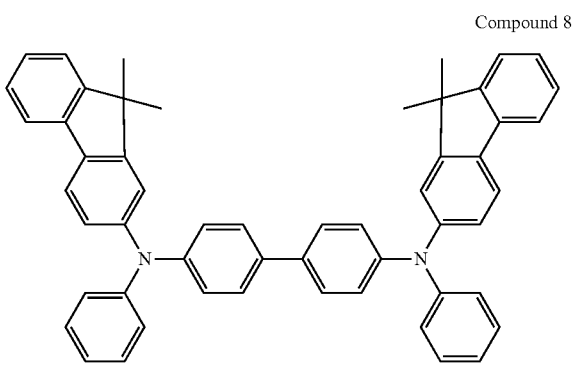

Compound 8

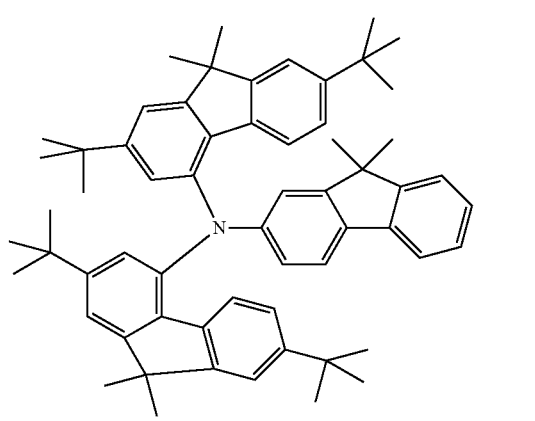

Compound 15

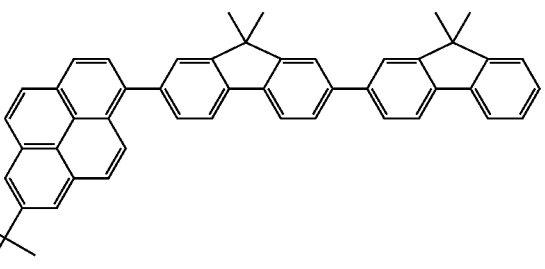

Compound 16

-continued

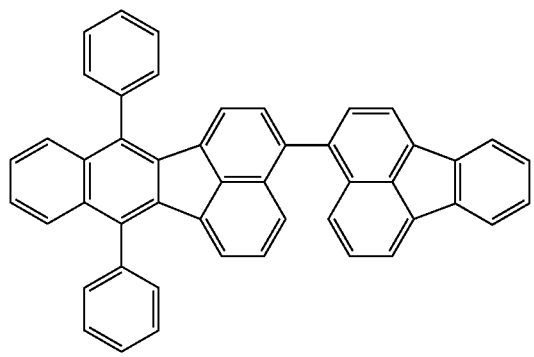

Compound 17

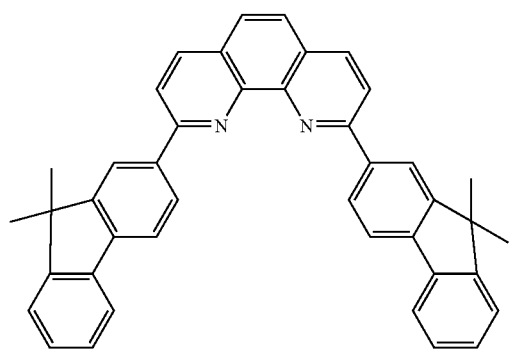

Compound 6

A sample for the verification experiment was produced by a method described below. First, indium tin oxide (ITO) was formed into a film on a glass substrate (substrate) by a sputtering method to form an anode. At this time, the thickness of the anode was set to 130 nm. Next, the substrate on which the anode had been formed was subjected to ultrasonic cleaning with acetone and isopropyl alcohol (IPA) sequentially. Next, the cleaned product was subjected to cleaning by boiling with IPA, followed by drying. Further, the dried product was subjected to UV/ozone cleaning. The substrate treated by the method described above was used as a transparent conductive supporting substrate in a next step.

Next, Compound 8 (hole injection layer material) and chloroform were mixed to prepare a chloroform solution so that the solution had a concentration of 0.1 wt %. Next, the chloroform solution was dropped onto the ITO electrode, and was formed into a film by performing spin coating at a number of rotations of 500 RPM for 10 seconds and then at a number of rotations of 1,000 RPM for 1 minute. After that, the film was dried in a vacuum oven at 80° C. for 10 minutes to provide a hole injection layer from which the solvent in the film had been completely removed. The thickness of the hole injection layer obtained at this time was 11 nm.

Next, Compound 15 was formed into a film on the hole injection layer by a vacuum deposition method to form a hole transporting layer. At this time, the thickness of the hole transporting layer was set to 15 nm.

Next, Compound 16 (host) and Compound 17 (luminous dopant) were simultaneously deposited from boats different from each other onto the hole transporting layer by the vacuum deposition method to form an emitting layer. At this time, the concentration of the luminous dopant in the emitting layer was 5 wt % and the thickness of the emitting layer was set to 25 nm.

Next, Compound 6 was formed into a film on the emitting layer by the vacuum deposition method to form an electron transporting layer. At this time, the thickness of the electron transporting layer was set to 25 nm.

Thus, an organic compound layer formed of the hole injection layer, the hole transporting layer, the emitting layer, and the electron transporting layer was formed. It should be noted that each layer formed by the vacuum deposition method out of the layers constituting the organic compound layer was formed under the following conditions: a degree of vacuum at the time of the vapor deposition of $7.0 \times 10^{-5}$ Pa or less, and a film formation rate of 0.8 nm/sec or more and 1.0 nm/sec or less. However, the film formation rate of the emitting layer is the sum of the deposition rate of the host and the deposition rate of the dopant.

Next, lithium fluoride (LiF) was formed into a film on the organic compound layer by the vacuum deposition method to form an LiF film. At this time, the thickness of the LiF film was set to 0.5 nm, a degree of vacuum at the time of the vapor deposition was set to $1.0 \times 10^{-4}$ Pa, and a film formation rate was set to 0.05 nm/sec. Further, aluminum was formed into a film by the vacuum deposition method to form an Al film. At this time, the following conditions were adopted: a thickness of the Al film of 150 nm, a degree of vacuum at the time of the vapor deposition of $1.0 \times 10^{-4}$ Pa, and a film formation rate of 1.0 nm/sec or more and 1.2 nm/sec or less. It should be noted that a laminated thin film formed of the LiF film and the Al film functions as an electron injection electrode (cathode).

Next, in a nitrogen atmosphere having a temperature that is dew point minus 70° C. or less, the produced organic light emitting device was covered with a protective glass plate and sealed with an epoxy-based adhesive material so that moisture did not adsorb to the organic light emitting device. It should be noted that an excavation was formed in the adhesive surface side of the protective glass and a sheet for moisture adsorption (moisture getter sheet for an organic EL, manufactured by DYNIC CORPORATION) was encapsulated therein. The organic light emitting device serving as a sample for the verification experiment was obtained by the foregoing method. Hereinafter, the organic light emitting device is referred to as "sample 1".

(2) Verification Experiment

A rectangular wave voltage formed of a reverse bias of −10 V (1 msec) and a forward bias of +5.6 V (1 msec) was repeatedly applied to the sample 1 at a period of 1 Hz. It should be noted that a value at the time when no voltage is applied to the sample 1 in the experiment is 0 V. Here, when the forward bias of +5.6 V is applied, a charge is injected into the emitting layer, and an exciton in the minimum excited singlet ($S_1$) state and an exciton in the minimum excited triplet ($T_1$) state are produced. In addition, upon application of the forward bias of +5.6 V to the sample 1 at the time of driving in a steady state, a current of about 100 mA/cm² passes through the sample.

Then, when the reverse bias of −10 V is applied after the completion of the application of the forward bias, the charge in the emitting layer is withdrawn through an electrode. At this time, light is emitted from a molecule in the minimum excited singlet state for a time period of the order of several nanoseconds, and hence an exciton itself immediately annihilates. On the other hand, a molecule in the minimum excited triplet state has a long excitation lifetime, and hence the exciton may remain in the emitting layer for several tens of microseconds to several hundreds of microseconds.

Here, the organic light emitting device was repeatedly irradiated with pulse light having a wavelength of 470 nm at the following timing: 1 μsec after the application of the reverse bias. The pulse light is obtained by subjecting laser light to light wavelength conversion with an OPO (Surelite OPO manufactured by Continuum), and laser light having a pulse width of about 4 nsec and an output of about 4 mW was condensed on the driving portion of the organic light emitting device having a diameter of 2 mm. At this time, specifically, an Nd:YAG laser Surelite (manufactured by Continuum) was used as a pulse light source. It should be noted that an organic material in the organic light emitting device does not absorb light having a wavelength of 470 nm when in its ground state, and hence only a molecule in the minimum excited triplet state remaining in the emitting layer absorbs the laser light and is further excited. As a result, an exciton in a high-order excited triplet ($T_n$) state is produced.

After the voltage application and the laser irradiation had been repeatedly performed for 5 hours as described above, current efficiency (cd/A) was measured and compared with that before the experiment. As a result, the current efficiency of the device subjected to the voltage application and the laser irradiation reduced by about 8% at the time of the application of 3 V as compared with that before the experiment. For information, as determined from the following calculation expression, the cumulative energizing time of a forward direction current to be applied to the organic light emitting device upon application of the rectangular wave voltage was 0.05 h.

$$1\ [msec] \times 10\ [Hz] \times 5\ [h] = 0.05\ [h]$$

Next, a sample 2 produced by exactly the same method as the production method for the sample 1 was subjected to rectangular wave voltage application and laser irradiation in the same manner as in the sample 1 except that a voltage at the time of the forward bias of a rectangular wave was set to +2.4 V in the sample 2. Here, the voltage of +2.4 V is as low as a threshold voltage or less, and hence no charge injection into an emitting layer is performed upon application of the forward bias. Accordingly, none of an exciton in the minimum excited singlet state and an exciton in the minimum excited triplet state is produced in the sample 2. Therefore, the production of an exciton in a high-order excited triplet state is not caused by the laser irradiation. After the voltage application and the laser irradiation had been repeatedly performed for 5 hours under the condition, current efficiency (cd/A) was measured and compared with that before the experiment. As a result, a change in current efficiency was equal to or less than a measurement error (about 1%).

Next, a sample 3 produced in exactly the same manner as in the sample 1 was subjected to rectangular wave voltage application in the same manner as in the sample 1, but the sample 3 was not subjected to laser irradiation. After the voltage application had been performed for 5 hours, current efficiency (cd/A) was measured and compared with that before the experiment. As a result, a change in current efficiency was equal to or less than the measurement error (about 1%).

(3) Discussion on Result of Verification Experiment

Of the three kinds of samples, only the sample 1 showed a remarkable reduction in efficiency. It is assumed from the foregoing that the reduction of the efficiency of the organic light emitting device was caused by the production of an exciton in a high-order excited triplet state caused by the injection of an excitation energy due to the irradiation of an exciton in the minimum triplet excited state with laser.

It is assumed from the verification experiment that the device deteriorated owing to the excitation of an exciton in the minimum triplet excited state by irradiation light from outside the device. However, an actual organic light emitting device may also deteriorate owing to the excitation of an exciton by the light emission of an emitting material occurring in its emitting layer. As a result of their extensive studies, however, the inventors have recognized the essence of the deterioration of the efficiency of an organic light emitting device caused by the production of an exciton in a high-order excited triplet state. That is, the inventors have considered that light from outside the device or from its emitting layer is not a main cause for the deterioration, but rather the deterioration occurs owing to the excitation of an exciton in the minimum excited triplet state by the transfer of energy from an emitting material in the minimum excited singlet state to the exciton in the minimum excited triplet state.

This is because the inventors have considered that the probability that energy transfers from the emitting material in the excited state to the exciton in the minimum triplet excited state may be more efficient and dominant than the probability that the exciton in the minimum triplet excited state absorbs the light emission from the emitting material (light emission-reabsorption). The energy transfer also occurs through the exciton in the minimum excited triplet state as in the case of the light emission-reabsorption.

In particular, the transfer of energy from the minimum excited singlet state having a high energy, i.e., Forster-type energy transfer may be important. This is because a high-order excited triplet state having a higher energy is more unstable and is more liable to cause material deterioration.

As described above, the inventors of the present invention have considered that an exciton in a high-order excited triplet state produced by the transfer of energy from the emitting material in the minimum excited singlet state to an exciton in the minimum excited triplet state serves as a deterioration path (deterioration cause). In view of the foregoing, in the present invention, effective suppression of the deterioration of the device and an improvement in driving lifetime thereof are enabled by an approach to inhibiting the formation of the deterioration path, specifically, the control of a material constituting the emitting layer from the viewpoint of the absorption spectrum of the exciton in the minimum excited triplet state.

In particular, when the energy of the exciton in a high-order excited triplet state is high, the deterioration may be additionally remarkable. Accordingly, particularly in the case of a blue light emitting device whose luminescent color has a high energy, the deterioration is of concern. Accordingly, the effect of the present invention significantly appears particularly in the case of the blue light emitting device.

It should be noted that blue light emission in the present invention refers to light emission showing xy chromaticity coordinates in a blue range in the chromaticity classification of a JIS standard (JIS Z8110). In addition, as described later, an emission spectrum in the present invention is an emission spectrum obtained by: forming a thin film having the same construction as that of an emitting layer directly on a glass substrate; and measuring the photoluminescence of the thin film.

By the way, in the present invention, attention is paid to the minimum excited triplet state of a material having the smallest minimum excited triplet energy out of the constituent materials in the emitting layer. This is because a molecule having the highest existence probability out of the molecules in excited triplet states produced in the emitting layer originates from the material having the smallest minimum excited triplet energy.

In the organic light emitting device of the present invention, the absorption spectrum (T-T absorption spectrum) of the minimum excited triplet state of the material having the smallest minimum excited triplet energy in the emitting layer is prevented from having an absorption peak in the emission wavelength region of the emitting material. The foregoing is identical in meaning to the following: in the emission wavelength region of the emitting material, the absorption peak of the absorption spectrum in the minimum excited triplet state of the material having the smallest minimum excited triplet energy out of the constituent materials in the emitting layer is absent. In the present invention, the construction of the device can prevent the deterioration of the device because the construction suppresses the transfer of energy from the excited state of the emitting material to the minimum excited triplet state of the material having the smallest minimum excited triplet energy.

It should be noted that a state where the spectrum has the absorption peak means that a high-order excited triplet state is present at its corresponding energy (with the ground state defined as zero energies). When the spectrum has the absorption peak, the transfer of the energy from the emitting material to the minimum excited triplet state smoothly occurs. In addition, the emission wavelength region in the present invention refers to a wavelength range out of the emission spectrum of light emitted in the emitting layer in which an intensity equal to or more than one-fifth of the maximum intensity of the emission spectrum is obtained.

In addition, in the present invention, the absorption peak has only to clearly show, in the waveform of the absorption spectrum, that when the wavelength of the absorption peak is converted into energy, a high-order excited triplet state is present at the energy as a center (with the minimum excited triplet state defined as zero energies). Although a specific shape of the absorption peak at this time is not limited, the absorption peak is typically of a convex shape equal to or more than a measurement noise level. Here, the measurement noise level is determined by a measurement condition and the performance limit of an apparatus, and whether the peak is a measurement noise or not can be judged based on, for example, whether the peak is reproduced or not when measurement is performed multiple times. The following method is also available: whether the peak is an absorption peak inherent in a material of interest or not is judged by comparison with the result of the measurement of a sample formed only of a solvent in which the material of interest is not dissolved.

In addition, in the present invention, the light absorption quantity of a material in the minimum excited triplet state in the emission wavelength region is preferably small. More specifically, the light absorption quantity of the material in the minimum excited triplet state is preferably a measurement noise level or more and 6,500 or less in terms of a molar absorbance coefficient. The foregoing has been revealed by an experiment conducted by the inventors of the present invention. It should be noted that a preferred light absorption quantity of a molecule in the minimum triplet excited state can be represented as 6,500 [L/(mol·cm)] or less because the unit of the molar absorbance coefficient is [L/(mol·cm)].

The emitting material in the present invention refers to a material that emits light which one wishes to extract as light from the organic light emitting device. Therefore, for example, when the emitting layer is formed of the host and a luminous dopant, the luminous dopant is the emitting material.

In the present invention, the emitting layer of the organic light emitting device may contain any other material in addition to the material having the smallest minimum excited triplet energy and the emitting material. In addition, in the present invention, the emitting layer of the organic light emitting device may be constituted of a single material. In this case, a compound serving as the material having the smallest minimum excited triplet energy and a compound serving as the emitting material are identical to each other.

In addition, an approach involving reducing the lifetime of an exciton in the minimum excited triplet state in the emitting layer, i.e., an approach involving reducing an excitation lifetime is preferably available as an approach to additionally inhibiting the formation of the deterioration path. The approach can additionally suppress the transfer of the energy from the emitting material in the minimum excited singlet state to the exciton in the minimum excited triplet state. In order that the excitation lifetime of the exciton in the minimum excited triplet state may be reduced, the material having the smallest minimum excited triplet energy out of the materials in the emitting layer is preferably the host. The host is a material having the largest weight ratio out of the constituent materials for the emitting layer, and hence the exciton in the minimum excited triplet state easily moves between adjacent molecules. Accordingly, the phenomenon in which two excitons in the minimum excited triplet state collide with each other to annihilate, i.e., T-T annihilation (TTA) easily occurs. On the other hand, when the material having the smallest minimum excited triplet energy out of the materials in the emitting layer is a material having a small weight ratio in the emitting layer such as the dopant, the exciton in the minimum excited triplet state is trapped and liable to exist in the emitting layer for a long time period without annihilating. The trapping of the exciton in the minimum excited triplet state is not preferred in the present invention.

In the present invention, the minimum excited triple energy of each of the hole transporting layer provided in contact with the emitting layer and electron transporting layer provided in contact with the emitting layer is preferably larger than the minimum excited triplet energy of the material having the smallest minimum excited triplet energy in the emitting layer. Thus, an exciton in the minimum excited triplet state can be blocked by the hole transporting layer and the electron transporting layer, and hence collision between excitons in the minimum excited triplet state, and their annihilation, in the emitting layer can be promoted.

In the present invention, the material having the smallest minimum excited triplet energy in the emitting layer is more preferably a bipolar material. The bipolar material is a material having high charge transport properties whose both the hole mobility and electron mobility are $10^{-4}$ cm$^2$/Vs or more. The material having high charge transport properties has high molecular stacking property and a short intermolecular distance, and hence there is a high possibility that an exciton in the minimum excited triplet state diffuses. Thus, collision between excitons in the minimum excited triplet state, and their annihilation, in the emitting layer are promoted, and the excitation lifetime of the minimum excited triplet state easily shortens. A material having a pyrene skeleton is particularly preferred as the bipolar material. The material having a pyrene skeleton has high molecular stacking property because the pyrene skeleton as a main skeleton is a structure having high planarity. Accordingly, the diffusibility of the exciton in the minimum excited triplet state easily rises.

In addition, in the present invention, the material having the smallest minimum excited triplet energy in the emitting layer is more preferably a hydrocarbon compound free of a C—N single bond, which is produced by bonding between an amino group and an aromatic hydrocarbon or between an aromatic hydrocarbon and a heterocycle, in a molecule thereof. The dissociation energy of a single bond (C—C single bond) between a C atom and a C atom produced by bonding between aromatic hydrocarbons or the dissociation energy of a C—C single bond produced by bonding between an aromatic hydrocarbon and an alkyl group is about 4 eV to 5 eV. In contrast, for example, the dissociation energy of a single bond (C—N single bond) between a C atom and an N atom produced by bonding between an amino group and an aromatic hydrocarbon or the dissociation energy of a C—N single bond produced by bonding between a heterocycle and an aromatic hydrocarbon is about 3 eV to 4 eV. In other words, a C—N single bond has dissociation energy smaller than that of a C—C single bond, and hence the bond easily dissociates via an excited state.

In the present invention, a charge recombination region in the emitting layer is desirably wide in its thickness direction. If the charge recombination region is extremely localized toward a narrow region such as an interface between the emitting layer and a layer adjacent to the emitting layer, the density of an exciton in the minimum excited singlet state in an emitting region increases, and hence the transfer of energy from the minimum excited singlet state to the minimum excited triplet state is liable to occur. In this case, the deterioration of the device due to its continuous driving is liable to be remarkable. Described below is a requirement for the inhibition of the occurrence of the deterioration due to the continuous driving without extreme localization of the charge recombination region toward the narrow region of the interface between the emitting layer and the adjacent layer.

As a result of their investigation, the inventors of the present invention have found that a compound having a pyrene skeleton is particularly excellent in electron transport property. That is, the inventors have found that when the compound having a pyrene skeleton is used, a layer containing the compound having a pyrene skeleton tends to be likely to have an electron mobility of $1 \times 10^{-4}$ cm$^2$/Vs or more. Therefore, the introduction of the compound having a pyrene skeleton into the emitting layer can reduce the driving voltage of the device and hence can improve its power efficiency. On the other hand, however, the introduction has heretofore involved the following problem: a carrier balance between an electron and hole in the emitting layer is lost, and hence the emitting (charge recombination) region is extremely localized toward the interface of the emitting layer on a side closer to the anode. Accordingly, a reduction in emission efficiency of the device and its deterioration due to its continuous driving have sometimes emerged as problems.

In order that the problems may be alleviated, in the present invention, the emitting layer is doped with a luminous dopant having a specific function. Here, the specific function of the luminous dopant refers to the following: the luminous dopant has energy satisfying a relationship represented by the following expression (I) with the host.

$$EL_D - EL_H \geq 0.15 \text{ eV} \tag{I}$$

In the expression (I), $EL_D$ is a parameter that can be derived from the following expression (Ia).

$$EL_D = |Ip_D| - EG_D \tag{Ia}$$

In the expression (Ia), $Ip_D$ represents the ionization potential of the luminous dopant and $EG_D$ represents the energy gap of the luminous dopant.

In the expression (I), $EL_H$ is a parameter that can be derived from the following expression (Ib).

$$EL_H = |Ip_H| - EG_H \tag{Ib}$$

In the expression (Ib), $Ip_H$ represents the ionization potential of the compound having a pyrene skeleton and $EG_H$ represents the energy gap of the compound having a pyrene skeleton.

It should be noted that the $EL_D$ and $EL_H$ as parameters in the expression (I) are each a relative indicator, i.e., the so-called relative value of an orbital energy involved in electron transport.

Here, when the orbital energy (relative value) involved in the electron transport satisfies the relationship represented by the expression (I), the luminous dopant functions as an electron trapping dopant and the electron transport performance of the emitting layer reduces as compared with that of the host alone. That is, the electron mobility in the emitting layer reduces as compared with the electron mobility of the host alone. Thus, problems such as the loss of the carrier balance and the extreme localization of the emitting region are alleviated. In addition, in the present invention, the electron mobility of the emitting layer is desirably reduced by the electron trapping performance of the luminous dopant by one or more orders of magnitude as compared with that of the host alone.

It should be noted that as a result of their measurement of the carrier mobility of the emitting layer and their investigation of the result of the measurement, the inventors of the present invention have also found that an electron trapping effect is not sufficient when the requirement represented by the expression (I) is not satisfied (when a relationship of $EL_D - EL_H < 0.15$ eV is satisfied).

In the present invention, the compound having a pyrene skeleton serving as the host has a hole mobility $\mu_H$ of $5 \times 10^{-5}$ cm$^2$/Vs or less. In the present invention, the luminous dopant functions as an electron trap and hence the electron mobility in the emitting layer serving as the indicator of the electron transport performance of the emitting layer reduces. Here, when the hole mobility of the emitting layer is relatively large as compared with the electron mobility in the emitting layer, a balance between carriers (an electron and a hole) in the emitting layer is lost, and hence the emitting region is extremely localized toward the interface of the emitting layer on a side closer to the cathode. As a result, a reduction in emission efficiency of the device and its deterioration due to its continuous driving are liable to occur.

In view of the foregoing, the hole mobility $\mu_H$ of the host alone is adjusted to $5 \times 10^{-5}$ cm$^2$/Vs or less. Specifically, a material having a hole mobility $\mu_H$ of $5 \times 10^{-5}$ cm$^2$/Vs or less is used as the host for the emitting layer. Thus, the carrier balance in the emitting layer is hardly lost and hence the localization of the emitting region is alleviated.

In addition, the electron mobility and hole mobility in the emitting layer are preferably prevented from largely deviating from each other from the viewpoint of the alleviation of the localization of the emitting region. In view of the foregoing, when the hole mobility of the emitting layer containing the compound having a pyrene skeleton serving as the host is represented by $\mu_{HEML}$ and the electron mobility of the emitting layer containing the compound having a pyrene skeleton is represented by $\mu_{EEML}$ r a requirement represented by the following expression (II) is preferably satisfied.

$$0.1 \leq \{\mu_{HEML}/\mu_{EEML}\} \leq 1{,}000 \tag{II}$$

Here, a requirement represented by the following expression (IIa) is more preferably satisfied.

$$0.1 \leq \{\mu_{HEML}/\mu_{EEML}\} \leq 200 \tag{IIa}$$

In the present invention, the compound having a pyrene skeleton serving as the host is preferably a compound further containing a partial structure having a triphenylene skeleton. When at least one triphenylene skeleton is further introduced as a substituent into the compound having a pyrene skeleton, the hole mobility of the host itself can be set to a value sufficient to exert the effects of the present invention, specifically, $5 \times 10^{-5}$ cm$^2$/Vs or less.

Here, the compound having a pyrene skeleton serving as the host is particularly preferably a compound represented by the following general formula [1] or [2].

In the general formula [2], n represents an integer of 0 or more and 2 or less.

By the way, the compounds represented by the general formula [1] and the general formula [2] each have the following features (i) and (ii) by virtue of their structures: (i) the compound has high amorphous property and high heat resistance; and (ii) both an electron and a hole each easily obtain a suitable carrier injection level.

In the present invention, a compound to be used as the luminous dopant is preferably, for example, a fluoranthene derivative or a boron complex. This is because the absolute value of the $EL_D$ of any such luminous dopant tends to be large. Specific examples of the fluoranthene derivative and the boron complex include compounds having basic skeletons shown below. However, the present invention is not limited thereto.

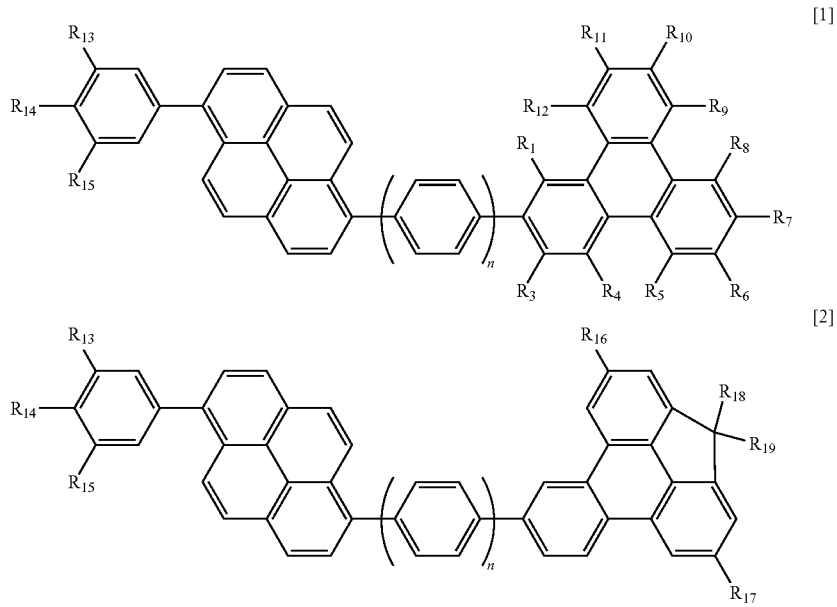

In the general formula [1], $R_1$ to $R_{15}$ each represent a hydrogen atom or a substituted or unsubstituted alkyl group, and may be identical to or different from each other.

Examples of the alkyl group represented by any one of $R_1$ to $R_{15}$ include a methyl group, an ethyl group, an n-propyl group, an iso-propyl group, an n-butyl group, an iso-butyl group, a sec-butyl group, and a tert-butyl group.

As a substituent that the alkyl group may further have, there are given, for example, an alkyl group such as a methyl group, an ethyl group, an n-propyl group, an iso-propyl group, an n-butyl group, an iso-butyl group, a sec-butyl group, or a tert-butyl group.

In the general formula [1], n represents an integer of 0 to 2.

In the general formula [2], $R_{13}$ to $R_{17}$ each represent a hydrogen atom or a substituted or unsubstituted alkyl group, and may be identical to or different from each other.

In the general formula [2], $R_{18}$ and $R_{19}$ each represent a substituted or unsubstituted alkyl group, and may be identical to or different from each other.

In the general formula [2], specific examples of the alkyl group represented by any one of $R_{13}$ to $R_{19}$ and the substituent that the alkyl group may further have are the same as the specific examples of the alkyl group represented by any one of $R_1$ to $R_{15}$ in the general formula [1].

[Fluoranthene derivative]

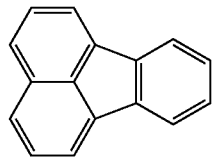

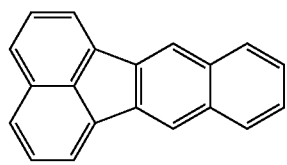

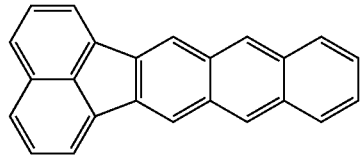

-continued
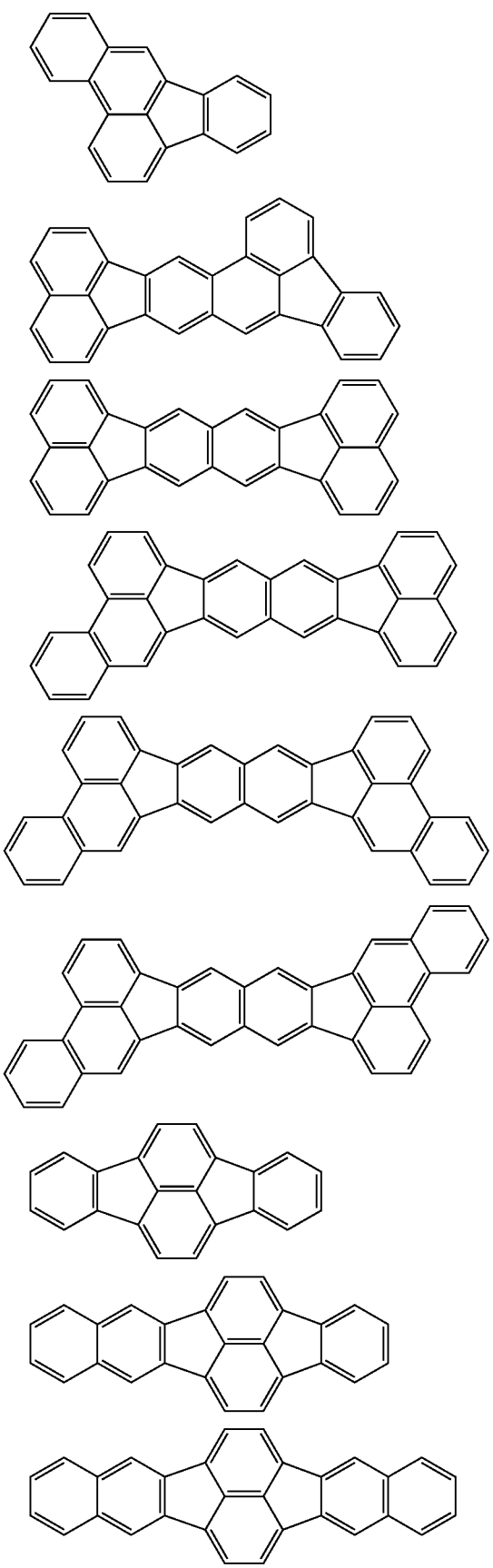
-continued
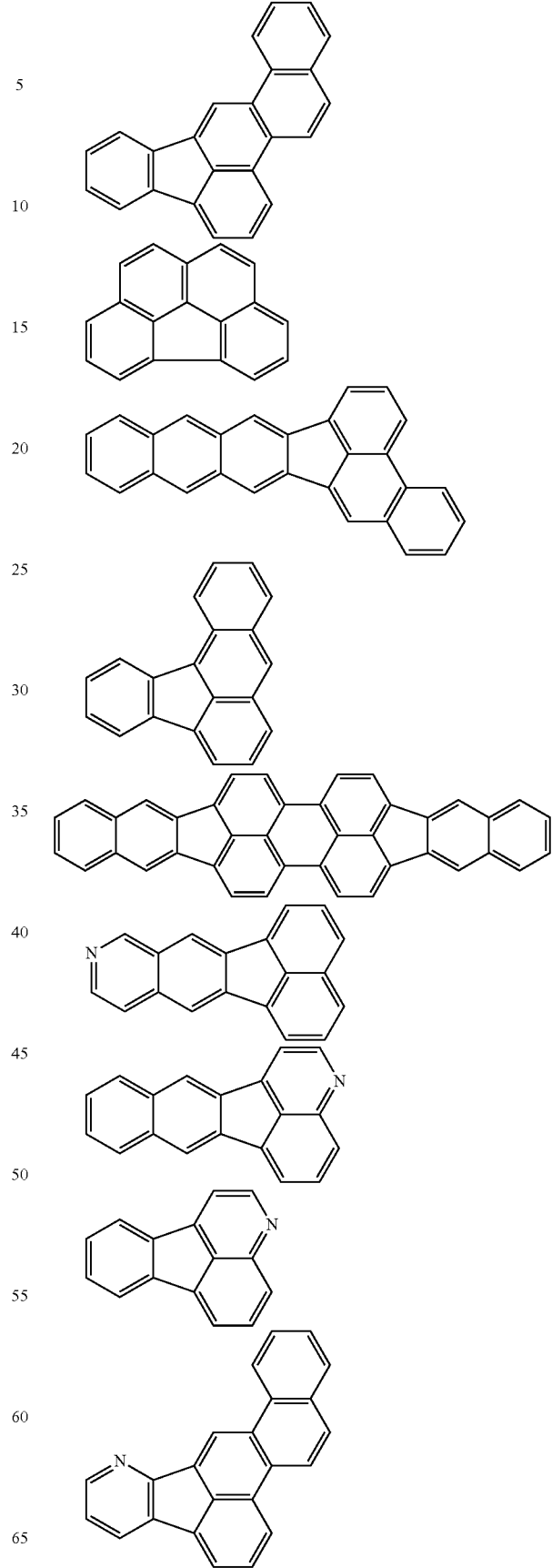

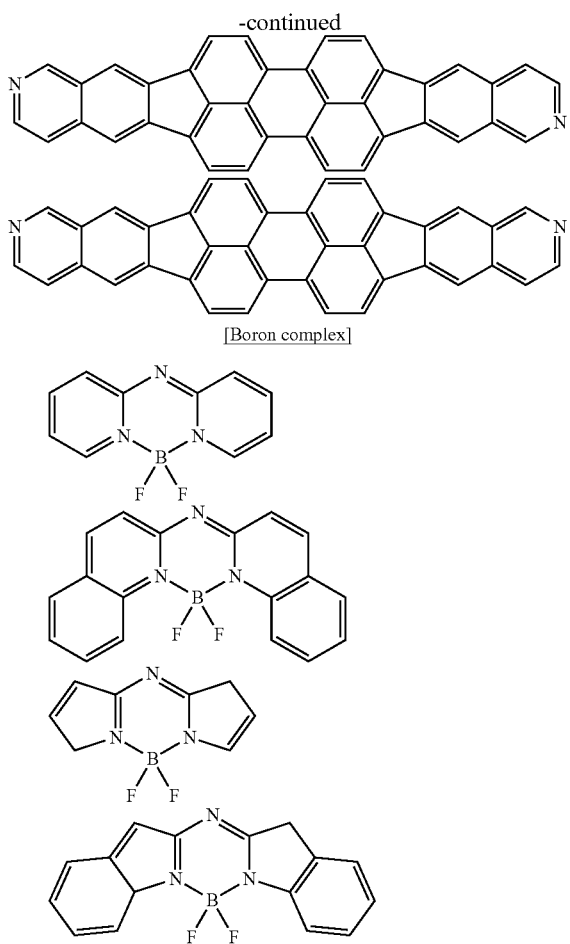

[Boron complex]

In the present invention, the mixing concentration of the host and luminous dopant in the emitting layer is appropriately set in consideration of the electron trapping mechanism and the transfer of energy from the host to the luminous dopant. Specifically, the concentration of the luminous dopant with respect to the host is preferably 0.01 mass % or more and 20 mass % or less, more preferably 0.2 mass % or more and 5 mass % or less.

The organic light emitting device of the present invention is a light emitting device suitable for emitting blue light. The device is also suitably used when white light is output to the outside. When the organic light emitting device of the present invention is used as an organic light emitting device that emits white light, two kinds of constructions described below are available as the construction of the emitting layer constituting the device.

A first construction is such that the emitting layer (comprehending a layer corresponding to the emitting layer) is a single layer. In the first construction, a layer serving as the emitting layer (comprehending the layer corresponding to the emitting layer) contains multiple kinds of emitting materials. In addition, at least one kind of the multiple kinds of emitting materials emits light having a color different from that of any other emitting material.

A second construction is such that the organic compound layer has a laminate formed of multiple emitting layers. In the second construction, multiple emitting layers each containing an emitting material that emits light having a predetermined luminescent color are provided. At least one layer of those multiple emitting layers is an emitting layer that emits light having a color different from that of any other emitting layer.

In the organic light emitting device of the present invention, a low-molecular weight or high-molecular weight hole injectable/transportable compound, a compound serving as the host, a luminous compound, an electron injectable/transportable compound, and the like which are conventionally known can be used together as required.

Examples of those compounds are described below.

The hole injectable/transportable compound is preferably a material having a high hole mobility in order to facilitate the injection of a hole from an anode and allow the injected hole to be transported to an emitting layer. Examples of low-molecular weight and high-molecular weight materials each having hole injection performance or hole transport performance include, but of course not limited to, a triarylamine derivative, a phenylenediamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, poly(vinylcarbazole), poly(thiophene), and any other conductive polymer.

A known compound serving as a fluorescent material can be used as the luminous compound.

The electron injectable/transportable compound can be arbitrarily selected from compounds each having a function with which the injection of an electron from a cathode is facilitated and a function with which the injected electron is transported to the emitting layer, and is selected in consideration of, for example, a balance with the hole mobility of the hole injectable compound or the hole transportable compound. Examples of a compound having electron injection performance or electron transport performance include, but of course not limited to, an oxadiazole derivative, an oxazole derivative, a triazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. In addition, a material having a large ionization potential can be used also as a hole blocking material.

In the organic light emitting device of the present invention, an organic compound layer including at least a hole transporting layer, an emitting layer, and an electron transporting layer is formed by the following method. In general, a thin film is formed by a vacuum deposition method, an ionized vapor deposition method, sputtering, or plasma. Alternatively, a thin film is formed by: dissolving a material in an appropriate solvent; and applying the solution by a known application method (such as spin coating, dipping, a cast method, an LB method, or an ink-jet method). In this case, a layer formed by, for example, the vacuum deposition method or the solution application method hardly undergoes crystallization or the like and has excellent temporal stability. In addition, when a film is formed by the application method, the film can be formed in combination with an appropriate binder resin.

Examples of the binder resin include, but not limited to, a polyvinyl carbazole resin, a polycarbonate resin, a polyester resin, an ABS resin, an acrylic resin, a polyimide resin, a phenol resin, an epoxy resin, a silicone resin, and a urea resin. In addition, one kind of those binder resins may be used alone as a homopolymer or a copolymer, or two or more kinds thereof may be used as a mixture. Further, as required, a known additive such as a plasticizer, an antioxidant, or a UV absorber may be used in combination.

A constituent material for the anode desirably has as large a work function as possible. Examples thereof include: metal simple substances such as gold, platinum, silver, copper, nickel, palladium, cobalt, selenium, vanadium, and tungsten, or alloys thereof; and metal oxides such as tin oxide, zinc oxide, indium oxide, indium tin oxide (ITO), and indium zinc oxide. A conductive polymer such as polyaniline, polypyrrole, or polythiophene may also be used. One kind of those electrode substances may be used alone, or two or more kinds thereof may be used in combination. In addition, the anode may be constituted of a single layer, or may be constituted of multiple layers.

On the other hand, a constituent material for the cathode desirably has a small work function. Examples thereof include: alkali metals such as lithium; alkaline earth metals such as calcium; and metal simple substances such as aluminum, titanium, manganese, silver, lead, and chromium. Alternatively, an alloy obtained by combining these metal simple substances may also be used. For example, magnesium-silver, aluminum-lithium, or aluminum-magnesium may be used. It is also possible to utilize a metal oxide such as indium tin oxide (ITO). One kind of those electrode substances may be used alone, or two or more kinds thereof may be used in combination. In addition, the cathode may be constituted of a single layer, or may be constituted of multiple layers.

In addition, at least one of the anode and the cathode is desirably transparent or semitransparent.

Although the substrate to be used in the present invention is not particularly limited, a nontransparent substrate such as a metal substrate or a ceramic substrate, or a transparent substrate such as glass, quartz, or a plastic sheet is used. In addition, the luminescent color of the device can be controlled by using a color filter film, a fluorescent color conversion filter film, a dielectric reflection film, or the like for the substrate. In addition, the device can be produced as follows: a thin-film transistor (TFT) is produced on the substrate and the device is connected thereto.

In addition, with regard to the direction in which light is extracted from the device, both a bottom emission construction (construction in which light is extracted from a substrate side) and a top emission construction (construction in which light is extracted from the side opposite to the substrate) are possible.

It should be noted that the produced device may be provided with a protective layer or a sealing layer for the purpose of preventing the device from being brought into contact with, for example, oxygen or moisture. Examples of the protective layer include: a diamond thin film; an inorganic material film made of, for example, a metal oxide or a metal nitride; a polymer film made of, for example, a fluorine resin, polyparaxylene, polyethylene, a silicone resin, or a polystyrene resin; and a photocurable resin. In addition, the device itself can be covered with glass, a gas impermeable film, a metal, or the like, and then be packaged with an appropriate sealing resin.

(2) Applications of Organic Light Emitting Device

The organic light emitting device of the present invention may be used as a constituent member for a display apparatus or a lighting apparatus. In addition, the device finds applications in, for example, an exposing light source for an electrophotographic image forming apparatus, a backlight of a liquid crystal display apparatus, and a light emitting apparatus including a color filter for a white light source. Examples of the color filter include filters that transmit three colors, i.e., red, green, and blue.

A display apparatus of the present invention includes the organic light emitting device of the present invention in a display portion. It should be noted that the display portion includes multiple pixels.

In addition, the pixels each include the organic light emitting device of the present invention and a transistor as an example of an active device (a switching device) or amplifier for controlling an emission luminance, and the anode or cathode of the organic light emitting device and the drain electrode or source electrode of the transistor are electrically connected. Here, the display apparatus can be used as an image display apparatus for a PC or the like. The transistor is, for example, a TFT device and the TFT device is provided on, for example, the insulating surface of the substrate. In addition, the TFT device preferably includes an electrode formed of a transparent oxide semiconductor.

The display apparatus may be an image information processing apparatus that includes an image input portion for inputting image information from an area CCD, a linear CCD, a memory card, or the like, and displays the input image to the display portion.

In addition, a display portion which an imaging apparatus or an ink-jet printer includes may have a touch panel function. The driving system of the touch panel function is not particularly limited.

In addition, the display apparatus may be used in the display portion of a multi-function printer.

A lighting apparatus is an apparatus for lighting, for example, the interior of a room. The lighting apparatus may emit light of any one of a white color (having a color temperature of 4,200 K), a neutral white color (having a color temperature of 5,000 K), and blue to red colors.

A lighting apparatus of the present invention includes the organic light emitting device of the present invention and an AC/DC converter circuit (circuit for converting an AC voltage into a DC voltage) to be connected to the organic light emitting device for supplying a driving voltage to the organic light emitting device. It should be noted that the lighting apparatus may further include a color filter.

An image forming apparatus of the present invention is an image forming apparatus including: a photosensitive member; a charging device for charging the surface of the photosensitive member; an exposing device for exposing the photosensitive member to form an electrostatic latent image; and a developing device for developing the electrostatic latent image formed on the surface of the photosensitive member. Here, exposing device to be provided in the image forming apparatus, e.g., an exposing unit includes the organic light emitting device of the present invention.

In addition, the organic light emitting device of the present invention can be used as a constituent member (emitting member) for an exposing unit to expose a photosensitive member. The exposing unit including the organic light emitting device of the present invention includes, for example, at least one emitting point including the organic light emitting device of the present invention and an active device connected to the organic light emitting device of the present invention. The exposing unit preferably includes multiple emitting points. In addition, the emitting points are arrayed along a predetermined linear direction (such as the long axis direction of the photosensitive member).

Next, the display apparatus of the present invention is described with reference to the drawings. FIG. 1 is a schematic sectional view illustrating an example of a display apparatus including an organic light emitting device and a switching device connected to the organic light emitting device. It should be noted that the organic light emitting device of the present invention is used as the organic light emitting device constituting a display apparatus 1 of FIG. 1.

The display apparatus 1 of FIG. 1 includes a substrate 11 such as glass and a moistureproof film 12 for protecting a TFT device 18 as a switching device or an organic compound layer on the substrate. In addition, reference numeral 13 represents a metal gate electrode 13. Reference numeral 14 represents a gate insulating film 14 and reference numeral 15 represents a semiconductor layer.

The TFT device 18 includes the semiconductor layer 15, a drain electrode 16, and a source electrode 17. An insulating film 19 is provided on the TFT device 18. An anode 21 constituting the organic light emitting device and the source electrode 17 are connected through a contact hole 20.

It should be noted that the system of the electrical connection of the electrode (anode or cathode) in the organic light emitting device and the electrode (source electrode or drain electrode) in the TFT is not limited to the embodiment illustrated in FIG. 1. In other words, one of the anode and the cathode, and one of the source electrode and drain electrode of the TFT device have only to be electrically connected.

In the display apparatus 1 of FIG. 1, multiple organic compound layers are illustrated like one layer but an organic compound layer 22 may be multiple layers. Provided on a cathode 23 are a first protective layer 24 and second protective layer 25 for suppressing the deterioration of the organic light emitting device.

When the display apparatus 1 of FIG. 1 is a display apparatus that emits white light, the emitting layer in the organic compound layer 22 in FIG. 1 may be a layer obtained by mixing a red light emitting material, a green light emitting material, and a blue light emitting material. In addition, the emitting layer may be a laminated emitting layer obtained by laminating a layer formed of the red light emitting material, a layer formed of the green light emitting material, and a layer formed of the blue light emitting material. Further, alternatively, an embodiment in which the layer formed of the red light emitting material, the layer formed of the green light emitting material, and the layer formed of the blue light emitting material are arranged side by side to form domains in one emitting layer is permitted.

Although the transistor is used as a switching device in the display apparatus 1 of FIG. 1, an MIM device may be used as a switching device instead of the transistor.

In addition, the transistor used in the display apparatus 1 of FIG. 1 is not limited to a transistor using a monocrystalline silicon wafer and may be a thin-film transistor having an active layer on the insulating surface of a substrate. A thin-film transistor using monocrystalline silicon as an active layer, a thin-film transistor using non-monocrystalline silicon such as amorphous silicon or microcrystalline silicon as an active layer, or a thin-film transistor using a non-monocrystalline oxide semiconductor such as an indium zinc oxide or an indium gallium zinc oxide as an active layer is also permitted. It should be noted that the thin-film transistor is called a TFT device as well.

The transistor in the display apparatus 1 of FIG. 1 may be formed in a substrate such as an Si substrate. Here, the phrase "formed in a substrate" means that the transistor is produced by processing the substrate itself such as the Si substrate. In other words, the presence of the transistor in the substrate can be interpreted as follows: the substrate and the transistor are integrally formed.

Whether or not the transistor is provided in the substrate is selected depending on a definition. In the case of, for example, a definition of about a QVGA per inch, the organic light emitting device is preferably provided in the Si substrate.

In addition, the organic light emitting device according to the present invention may be connected to a switching device including an oxide semiconductor in its channel portion in order that its light emission may be controlled. The oxide semiconductor as a constituent material in the switching device may be amorphous or may be crystalline. In addition, the oxide semiconductor may be in a state where an amorphous portion and a crystalline portion are mixed. Here, when the oxide semiconductor is crystalline, a specific crystal form is, for example, a single crystal, a fine crystal, or a crystal in which a specific axis such as a C-axis is oriented. It should be noted that the form of the crystal may be one kind of the listed specific forms, or may be a mixture of two or more kinds of forms.

Although the organic light emitting device including the switching device described above may be used in an image display apparatus in which each organic light emitting device is provided as a pixel, the present invention is not limited thereto. For example, the device may be used as a lighting apparatus, or an exposing device for exposing a photosensitive member of an electrophotographic image forming apparatus such as a laser beam printer or a copying machine.

As described above, an image having good quality can be stably displayed for a long time period by driving the display apparatus using the organic light emitting device of the present invention.

Figure 2:
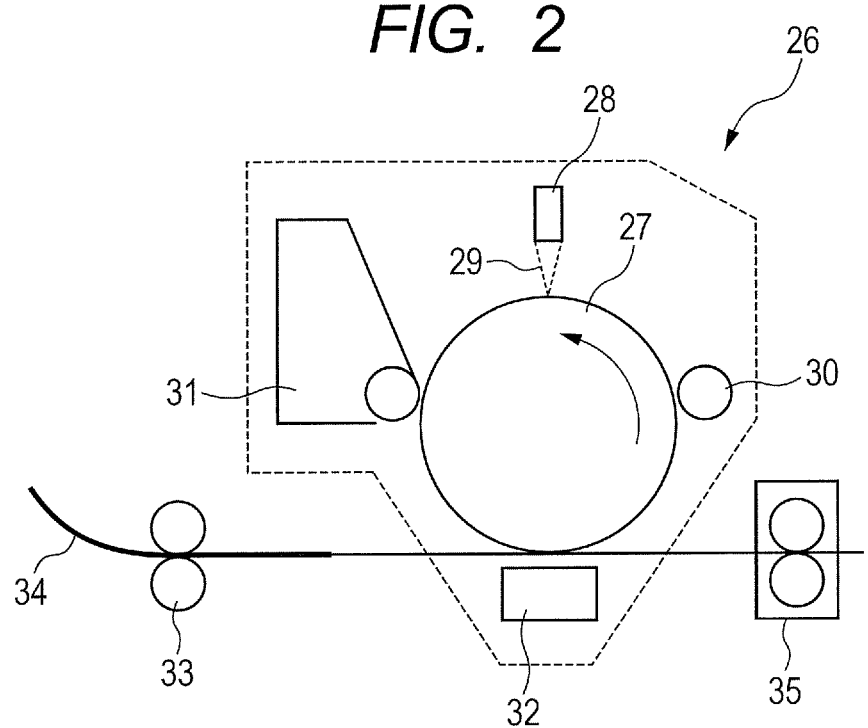
FIG. 2 is a schematic view illustrating an example of an image forming apparatus including the organic light emitting device according to the present invention. The upper and middle figures of FIG. 3 are each a schematic plan view illustrating a specific example of an exposing light source constituting the image forming apparatus of FIG. 2, and the lower figure thereof is a schematic view illustrating a specific example of a photosensitive member constituting the image forming apparatus of FIG. 2.

Next, other applications of the organic light emitting device of the present invention are described. FIG. 2 is a schematic view illustrating an example of an image forming apparatus including the organic light emitting device according to the present invention. An image forming apparatus 26 of FIG. 2 includes a photosensitive member 27, an exposing light source 28, a developing device 31, a charging device 30, a transferring device 32, a conveying roller 33, and a fixing device 35.

In the image forming apparatus 26 of FIG. 2, the photosensitive member 27 is irradiated with light 29 from the exposing light source 28, whereby an electrostatic latent image is formed on the surface of the photosensitive member 27. In the image forming apparatus 26 of FIG. 2, the exposing light source 28 includes the organic light emitting device according to the present invention. In addition, in the image forming apparatus 26 of FIG. 2, the developing device 31 includes toner or the like. In the image forming apparatus 26 of FIG. 2, the charging device 30 is provided for charging the photosensitive member 27. In the image forming apparatus 26 of FIG. 2, the transferring device 32 is provided for transferring a developed image to a recording medium 34 such as paper. It should be noted that the recording medium 34 is conveyed by the conveying roller 33 to the transferring device 32. In the image forming apparatus 26 of FIG. 2, the fixing device 35 is provided for fixing the image formed on the recording medium 34.

Figure 3:
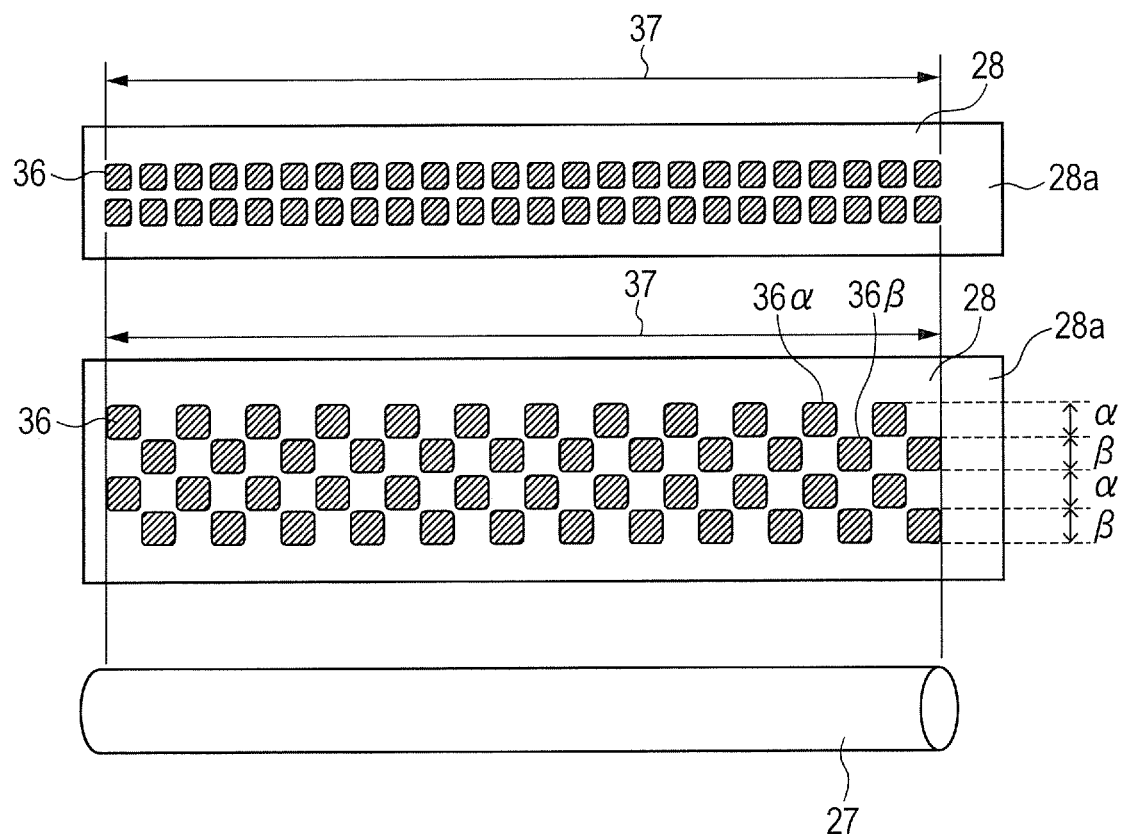

The upper figure of FIG. 3 and the middle figure of FIG. 3 are each a schematic plan view illustrating a specific example of the exposing light source constituting the image forming apparatus 26 of FIG. 2, and the lower figure of FIG. 3 is a schematic view illustrating a specific example of the photosensitive member constituting the image forming apparatus 26 of FIG. 2. It should be noted that the upper figure of FIG. 3 and the middle figure of FIG. 3 have the following point in common: the exposing light source 28 includes multiple emitting portions 36, each of which includes the organic light emitting device, placed on a long substrate 28*a*. In addition, an arrow represented by reference symbol 37 indicates a column direction in which the emitting portions 36 are arrayed. The column direction is the same as the direction of the axis about which the photosensitive member 27 rotates.

By the way, the upper figure of FIG. 3 illustrates a form in which the emitting portions 36 are placed along the axis direction of the photosensitive member 27. On the other hand, the middle figure of FIG. 3 illustrates a form in which the emitting portions 36 are alternately placed in the column direction in a first column α and a second column β, respectively. In the middle figure of FIG. 3, the first column α and the second column β are placed in a row direction at positions different from each other.

In addition, in the middle figure of FIG. 3, while multiple emitting portions 36α are placed at a certain interval in the first column α, the second column β includes an emitting portion 36β at a position corresponding to the interval between the emitting portions 36α in the first column α. That is, the exposing light source of the middle figure of FIG. 3 has the multiple emitting portions placed at a certain interval in the row direction as well.

It should be noted that the state of the exposing light source of the middle figure of FIG. 3 can be rephrased as follows: the emitting portions (36α and 36β) constituting the exposing light source are place in, for example, a lattice, zigzag, or checkered pattern.

Figure 4:
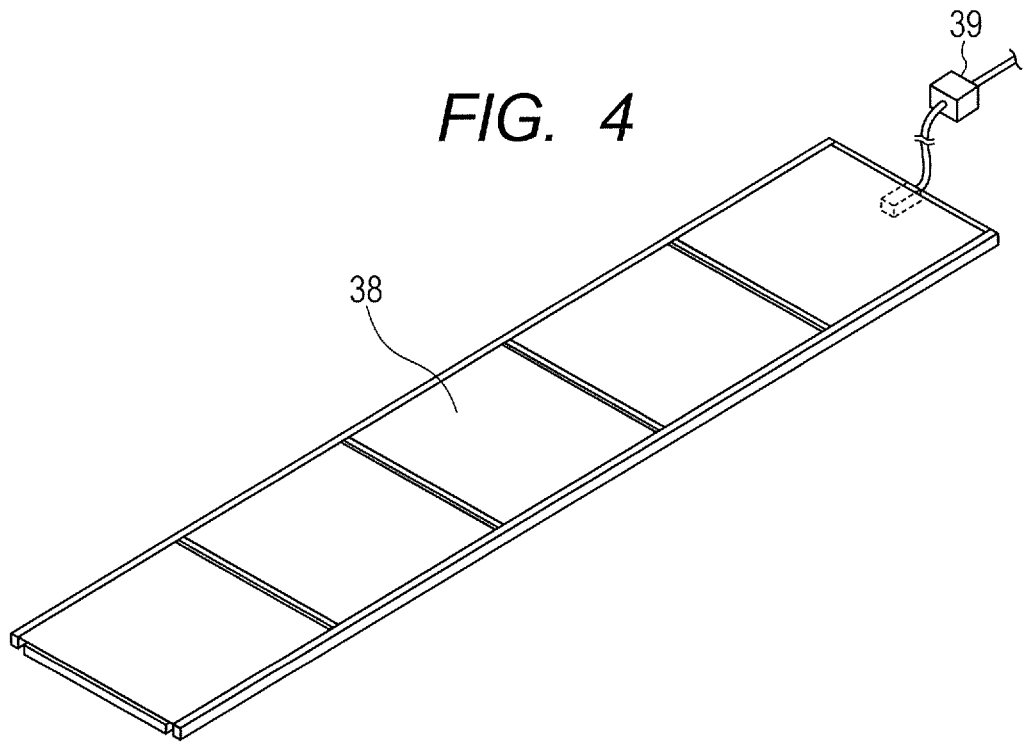
FIG. 4 is a schematic view illustrating an example of a lighting apparatus including the organic light emitting device according to the present invention.

FIG. 4 is a schematic view illustrating an example of a lighting apparatus including the organic light emitting device according to the present invention. The lighting apparatus of FIG. 4 includes an organic light emitting device 38 provided on a substrate (not shown) and an AC/DC converter circuit 39. In addition, the lighting apparatus of FIG. 4 may include a radiator plate (not shown) corresponding to a heat radiating portion for radiating heat in the apparatus to the outside on, for example, a substrate surface on a side opposite to the side on which the organic light emitting device 38 is mounted.

EXAMPLES

Hereinafter, the present invention is described more specifically by way of Examples. However, the present invention is not limited thereto.

Example 1

Produced in this example was an organic light emitting device having an anode, a hole injection layer, a hole transporting layer, an emitting layer, a hole blocking layer, an electron transporting layer, and a cathode laminated in the stated order on a substrate. Here, parts of the materials used in this example are listed below.

Compound 1

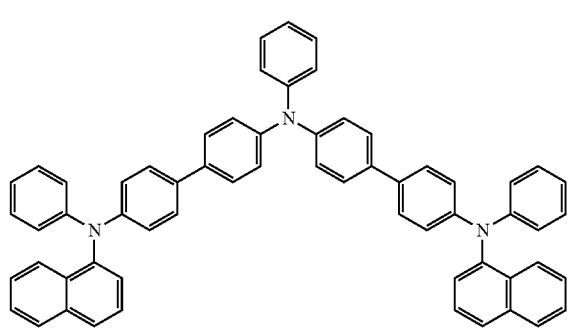

-continued

Compound 2

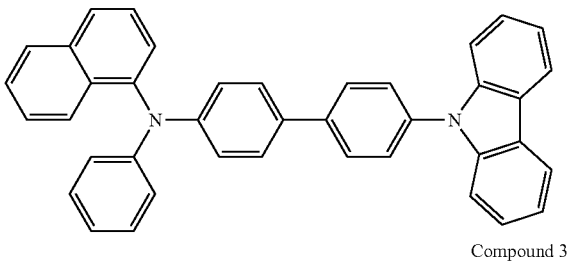

Compound 3

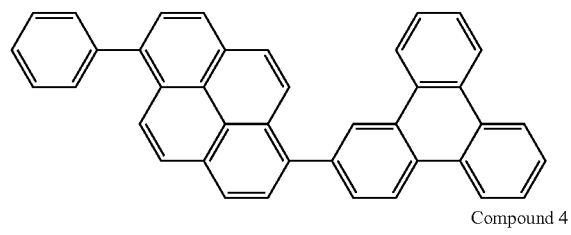

Compound 4

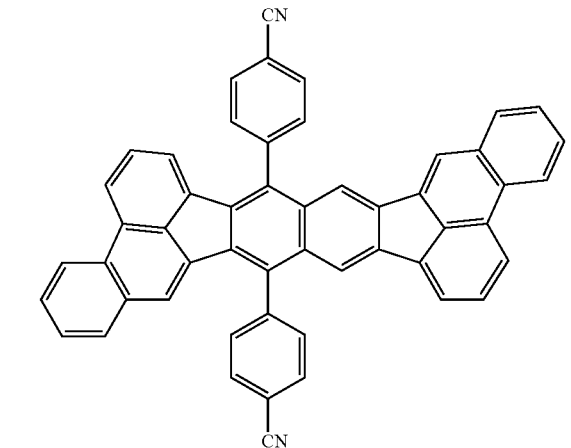

Compound 5

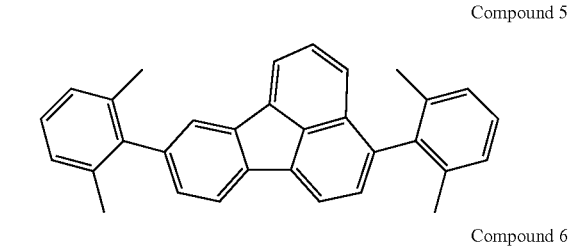

Compound 6

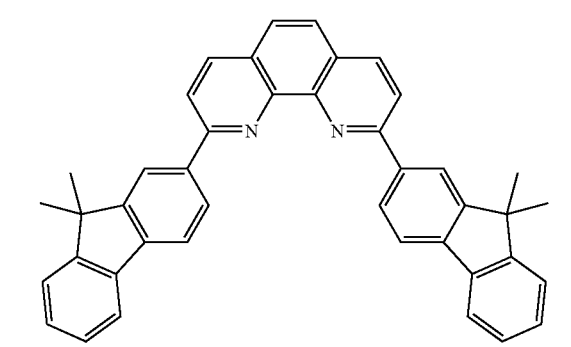

First, indium tin oxide (ITO) was formed into a film on a glass substrate (substrate) by a sputtering method to form the anode. At this time, the thickness of the anode was set to 100 nm. Next, the substrate on which the anode had been formed was subjected to ultrasonic cleaning with acetone and isopropyl alcohol (IPA) sequentially. Next, the cleaned product was subjected to cleaning by boiling with IPA, followed by drying. Further, the dried product was subjected to UV/ozone cleaning. The substrate treated by the method described above was used as a transparent conductive supporting substrate in a next step.

Next, Compound 1 (hole injection material) was formed into a film on the ITO electrode (anode) by a vacuum deposition method to form the hole injection layer. At this time, the thickness of the hole injection layer was set to 70 nm. Next, Compound 2 was formed into a film on the hole injection layer by the vacuum deposition method to form the hole transporting layer. At this time, the thickness of the hole transporting layer was set to 45 nm. Next, Compound 3 (host) and Compound 4 (luminous dopant) were simultaneously deposited from boats different from each other to form the emitting layer on the hole transporting layer. At this time, the thickness of the emitting layer was set to 25 nm and the concentration of Compound 4 in the emitting layer was controlled to 1 wt %. Next, Compound 5 was formed into a film on the emitting layer by the vacuum deposition method to form the hole blocking layer. At this time, the thickness of the hole blocking layer was set to 5 nm. Next, Compound 6 was formed into a film on the hole blocking layer by the vacuum deposition method to form the electron transporting layer. At this time, the thickness of the electron transporting layer was set to 30 nm. It should be noted that each of Compounds 1 to 6 described above was deposited under the following conditions: a degree of vacuum of $1.0 \times 10^{-4}$ Pa and a film formation rate of 0.1 nm/sec or more and 0.3 nm/sec or less. Next, lithium fluoride (LiF) was formed into a film on the electron transporting layer by the vacuum deposition method to form the electron injection layer. At this time, the thickness of the electron injection layer was set to 0.5 nm, and the vapor deposition was performed under the conditions of a degree of vacuum of $1.0 \times 10^{-4}$ Pa and a film formation rate of 0.05 nm/sec. Next, aluminum was formed into a film on the electron injection layer by the vacuum deposition method to form an electron injection electrode (cathode). At this time, the thickness of the electron injection electrode was set to 150 nm, and the vapor deposition was performed at a degree of vacuum of $1.0 \times 10^{-4}$ Pa and a film formation rate of 1.0 nm/sec or more and 1.2 nm/sec or less. Next, under a nitrogen atmosphere, the resultant device was covered with a protective glass plate and then sealed with an acrylic resin-based adhesive material so that the device did not deteriorate owing to its moisture adsorption. Thus, the organic light emitting device was obtained.

The characteristics of the resultant organic light emitting device were measured while the ITO electrode (anode) and aluminum electrode (cathode) of the organic light emitting device were defined as a positive electrode and a negative electrode, respectively. Specifically, the characteristics of the organic light emitting device were measured as follows: its current-voltage characteristics were measured with a microammeter 4140B manufactured by Hewlett-Packard Company, and its emission luminance and chromaticity were measured with a spectroradiometer SR3 manufactured by TOPCON CORPORATION. The device had CIE chromaticity coordinates (x, y) at a luminance of 1,000 cd/m$^2$ of (0.134, 0.163), and was observed to emit blue light derived from Compound 4. In addition, the device had a current efficiency at a luminance of 1,000 cd/m$^2$ of 10.9 cd/A. Further, when the device was continuously driven in a dry air atmosphere in a state where a current density was kept at 100 mA/cm$^2$, its luminance half time was as long as 1,100 hours.

In addition, the emission spectrum of an emitting material was measured by a method described below.

First, constituent materials for an emitting layer were formed into a film on a glass substrate by a vacuum deposition method to produce a sample. At this time, the thickness of the thin film, constituent materials of the thin film serving as the sample, and conditions under which the film was formed were the same as the conditions upon production of the emitting layer constituting the organic light emitting device of this example. Next, the photoluminescence of the resultant sample was measured with a fluorophotometer F4500 manufactured by Hitachi, Ltd. It should be noted that the emission spectrum of the emitting material is a spectrum obtained upon measurement of the photoluminescence.

Figure 5:
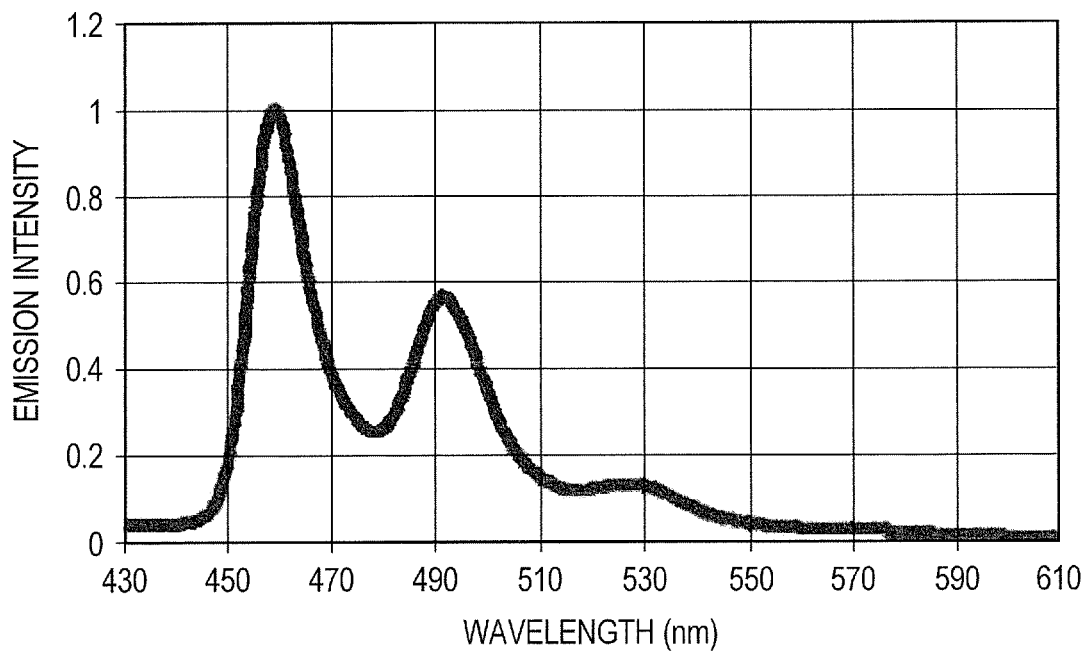
FIG. 5 shows the PL spectrum of an emitting material in Example 1.

The emission wavelength region of the luminous dopant (emitting material) was measured by the method described above. As a result, an emission spectrum shown in FIG. 5 was obtained. In addition, it was found from FIG. 5 that the emission wavelength region was evaluated to be 451 nm to 505 nm.

Next, the absorption spectrum of an excited triplet state of a material having the smallest excited triplet energy out of the constituent materials for the emitting layer was measured.

Here, the absorption spectrum (T-T absorption spectrum) of the minimum excited triplet state is obtained by measuring the T-T absorption spectrum of an organic material of interest with probe light when the material is irradiated with pump light to produce the minimum excited triplet state. The material excited with the pump light is brought into the minimum excited singlet state once but part of the material is brought into the minimum excited triplet state by intersystem crossing. In the case of a general fluorescent material, while the minimum excited triplet state has an excitation lifetime of the order of microseconds to milliseconds, the excitation lifetime of the minimum excited singlet state is extremely short, specifically, of the order of nanoseconds or less. Accordingly, the absorption spectrum 1 µs or more after the irradiation with the pump light can be regarded as the absorption spectrum (T-T absorption spectrum) of the minimum excited triplet state alone, and hence the absorption spectrum 1 µs or more after the irradiation with the pump light can be extracted as data. In this example, the absorption spectrum 1 µs to 10 µs after the irradiation with the pump light was extracted as data.

By the way, the absorbance of the minimum excited triplet state decays with time, but the absorbance of the minimum excited triplet state immediately after the irradiation with the pump light can be estimated by measuring the change of the absorption spectrum with time and extrapolating the decay curve of the absorbance with respect to time. Thus, the molar absorbance coefficient of a material in the minimum excited triplet state can be estimated from the absorbance in the minimum excited triplet state immediately after the irradiation with the pump light and the density of the minimum excited triplet state. The density of the minimum excited triplet state is the density of the material in the minimum excited triplet state in a solution, and can be estimated from the photon density of excitation light, the absorbance of the solution sample, an intersystem crossing ratio, and the position at which the sample is irradiated with the probe light. The intersystem crossing ratio is the ratio at which a material excited with the pump light and brought into the minimum excited singlet state is converted into the minimum excited triplet state by the intersystem crossing. A general fluorescent material emits light when the material that has been brought into the minimum excited singlet state returns to its ground state, but no light emission occurs when the material that has been brought into the minimum excited triplet state returns to the ground state. Accordingly, the intersystem crossing ratio can be calculated by measuring the fluorescence quantum yield of the solution and estimating the ratio of a non-emitting molecule out of the excited molecules.

In this example, the sample was obtained as described below. The organic material of interest and toluene were mixed to prepare a toluene solution. After that, the prepared solution was charged into a quartz cell and then its concentration was adjusted so that its absorbance became about 0.7 under the condition of an optical path length of 10 mm. After that, nitrogen bubbling was performed for 15 minutes to reduce an oxygen concentration in the solution.

The T-T absorption was measured with the sample prepared by the method described above. It should be noted that the following apparatus were used in the measurement.
Apparatus for measuring T-T absorption: time-resolved absorption spectrum analysis system Nanosecond System (manufactured by Hamamatsu Photonics K.K.)
Pump light source: small YAG pulse laser INDI-HG (manufactured by Spectra-Physics K.K. It should be noted that in the measurement, the excitation wavelength was set to 355 nm, the irradiation intensity was set to about 25 mW/cm$^2$, and the pulse frequency was set to 10 Hz.)
Probe light: xenon lamp L8004 (white light source, manufactured by Hamamatsu Photonics K.K.)
Probe light receiving part: high dynamic range streak camera C7700 (manufacture by Hamamatsu Photonics K.K.)
Apparatus for measuring absorbance of solution sample: spectrophotometer U-3010 (manufactured by Hitachi, Ltd.)
Apparatus for measuring fluorescent quantum yield of solution sample: absolute PL quantum yield measurement system C9920-02 (manufactured by Hamamatsu Photonics K.K.)

It should be noted that the minimum excited triplet energy can be determined from the phosphorescence spectrum of the organic material of interest. Specifically, the phosphorescence spectrum is measured under a low temperature such as liquid nitrogen temperature (77 K) and the minimum excited triplet energy is obtained from the first emission peak (peak at the shortest wavelength) of the measured phosphorescence spectrum. It should be noted that when phosphorescent emission is not obtained (phosphorescence is too weak to be measured), the energy can be estimated by utilizing energy transfer from a triplet sensitizer.

On the other hand, when the emission efficiency of the phosphorescence is so low that the phosphorescence cannot be measured by the method, the minimum excited triplet energy can be estimated by utilizing triplet-triplet energy transfer to an acceptor.

When the phosphorescent emission is not obtained even by performing the measurement, the minimum excited triplet energy can be theoretically calculated with computational chemistry software such as Turbomole by the following calculation approach. First, the structure optimization of the ground state is calculated by a density functional theory (DFT) with B3LYP as a functional and def2-SV(P) as a basis function. Next, the minimum excited triplet (absorption) energy in the optimized structure is calculated by a time-dependent density functional theory (TDDFT) with B3LYP as a functional and def2-SV(P) as a basis function. It should be noted that in the DFT and TDDFT calculations, computational chemistry software having the same functions may be used instead. An estimated value of the minimum excited triplet energy $T_1$(exp. film) [eV] measured in a film state can be obtained from the minimum excited triplet (absorption) energy $T_1$(calc.) [eV] calculated as described above by using the following correlation expression 1.

$$T_1(\text{exp./exp)}=0.4518 \times T_1(\text{calc.})+1.3248 \quad \text{Expression 1}$$

Functions, software, and the like to be used in determining $T_1$(calc.) are described below.
(1) Structure Optimization
Density functional theory (DFT)
Functional: B3LYP
Basis function: def2-SV(P)
Software: TURBOMOLE
(2) Minimum Excited Triplet (Absorption) Excitation Energy
Time-dependent density functional theory (TDDFT)
Density functional theory (DFT)
Functional: B3LYP
Basis function: def2-SV(P)
Software: TURBOMOLE
Software: TURBOMOLE:
TURBOMOLE:
R. Ahlrichs, M. Baer, M. Haeser, H. Horn, and C. Koelmel Electronic structure calculations on workstation computers: the program system TURBOMOLE Chem. Phys. Lett. 162: 165 (1989)

Here, the minimum triplet excitation energies of the materials (the host and the luminous dopant) used as the constituent materials for the emitting layer in this example were measured. First, a material of interest and Compound 18 (triplet sensitizer) shown below were simultaneously deposited from the vapor to form a thin film on a slide glass, thereby producing a sample for measurement.

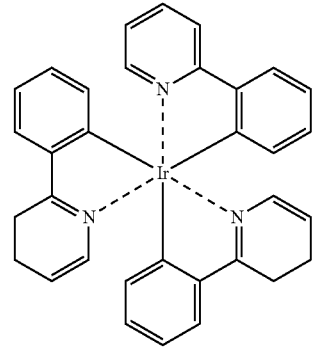

Compound 18

At this time, the concentration of Compound 18 (triplet sensitizer) with respect to the entirety of the thin film was 10 wt % and the thickness of the film was 100 nm. Next, the minimum triplet excitation energy was determined from a phosphorescence spectrum obtained by measuring the phosphorescence spectrum of the sample with a fluorophotometer F4500 (manufactured by Hitachi, Ltd.). Here, the phosphorescence spectrum was measured under a low temperature such as liquid nitrogen temperature (77 K). In addition, the minimum excited triplet energy ($T_1$) was determined from the first emission peak (peak at the shortest wavelength) of the measured phosphorescence spectrum.

As a result of the measurement and calculation, the minimum excited triplet energies of the host and the luminous dopant were 1.82 eV (host) and 1.90 eV (luminous dopant), respectively. Therefore, in this example, the material having the smallest minimum excited triplet energy in the emitting layer is found to be the host.

Figure 6:
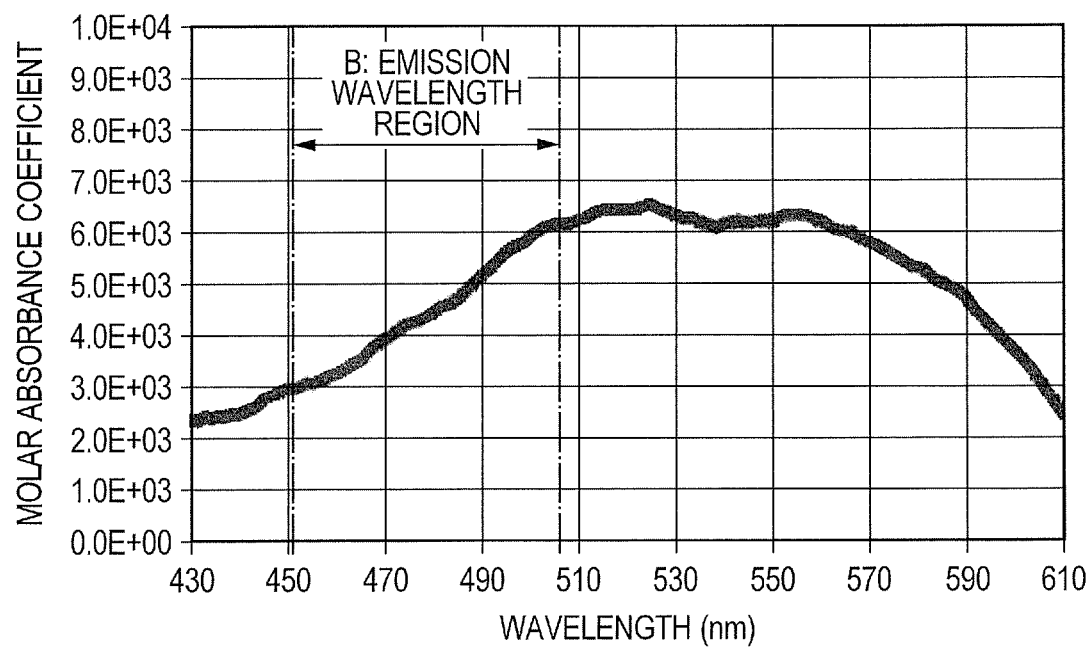
FIG. 6 shows the absorption spectrum of the minimum excited triplet state of Compound 3.

Next, the absorption spectrum of the minimum excited triplet state of the host was measured. The result was as shown in FIG. 6, and it was found that no absorption peak existed because a convex shape exceeding a measurement noise level was not observed in the emission wavelength region (region B) of the emitting material. It should be noted that a molar absorbance coefficient in the region B shown in FIG. 6 was 6,500 or less.

Next, the minimum excited triplet energies of Compound 2 as the constituent material for the hole transporting layer provided in contact with the emitting layer and Compound 5 as the constituent material for the hole blocking layer were measured. At this time, a material of interest was deposited from the vapor to form a thin film on a slide glass, thereby producing a sample for measurement. The minimum excited triplet energies measured and calculated by using such samples for measurement were 2.25 eV (Compound 2) and 2.10 eV (Compound 5), respectively. Therefore, the minimum excited triplet energies of the hole transporting layer and the hole blocking layer were found to be larger than the minimum excited triplet energy of the material having the smallest minimum excited triplet energy in the emitting layer.

It should be noted that in order to evaluate the ionization potentials of the host and the luminous dopant as the constituent materials for the emitting layer, the ionization potential of a thin film of the host or the luminous dopant obtained by a vacuum deposition method was measured in the air with a photoelectron spectrometer (manufactured by RIKENKIKI, CO., LTD., apparatus name: AC-3). In addition, the UV-visible light absorption spectrum of the thin film obtained by the vacuum deposition method was measured with an apparatus (manufactured by JASCO Corporation, apparatus name: V-560) and an energy gap was calculated from the result of the measurement.

$EL_D$ and $EL_H$ were determined by appropriately substituting the ionization potentials and energy gaps of the host and the luminous dopant obtained by the foregoing measurement into one of the following expressions (Ia) and (Ib).

$$EL_D = |Ip_D| - EG_D \quad \text{(Ia)}$$

$$EL_H = |Ip_H| - EG_H \quad \text{(Ib)}$$

(In the expression (Ia), $Ip_D$ represents the ionization potential of the luminous dopant and $EG_D$ represents the energy gap of the luminous dopant. In the expression (Ib), $Ip_H$ represents the ionization potential of a compound having a pyrene skeleton and $EG_H$ represents the energy gap of the compound having a pyrene skeleton.)

As a result, the $EL_H$ of the host was 3.05 eV and the $EL_D$ of the luminous dopant was 3.48 eV. Accordingly, a relationship of $EL_D - EL_H = 0.43$ eV was satisfied and the requirement represented by the expression (I) was found to be satisfied.

In addition, a first device for mobility measurement was produced by the following method in order to measure the carrier mobility of the host alone of the emitting layer.

First, the host (Compound 3) was formed into a film on a glass substrate with ITO by a vacuum deposition method. At this time, the thickness of the film formed of the host was set to 2 µm. Next, an aluminum film having a thickness of 150 nm was formed on the film formed of the host by the vacuum deposition method. Next, under a nitrogen atmosphere, the resultant device was covered with a protective glass plate, and then a UV-based adhesive was filled and cured so that the device did not deteriorate owing to the adsorption of moisture to the film formation surface of the device. Thus, the first device for mobility measurement was obtained.

The hole mobility $\mu_H$ of the resultant device (first device for mobility measurement) at a field intensity of $5 \times 10^5$ V/cm was measured with a time-of-flight measuring apparatus (TOF-301 manufactured by OPTEL). In this example, the hole mobility $\mu_H$ of the host was $7.6 \times 10^{-6}$ cm²/Vs.

Next, a second device for mobility measurement was produced by the following method in order to measure the carrier mobility of the emitting layer.

First, the host (Compound 3) and the luminous dopant (Compound 4) were codeposited from the vapor onto a glass substrate with ITO by employing the same method as the method of forming the emitting layer constituting the organic light emitting device to form a thin film having a thickness of 2 µm. Next, an aluminum film having a thickness of 150 nm was formed on the thin film containing the host and the luminous dopant by the vacuum deposition method. Next, under a nitrogen atmosphere, the resultant device was covered with a protective glass plate, and then a UV-based adhesive was filled and cured so that the device did not deteriorate owing to the adsorption of moisture to the film formation surface of the device. Thus, the second device for mobility measurement was obtained.

The carrier mobilities (electron mobility and hole mobility) of the emitting layer of the resultant device (second device for mobility measurement) can be measured by transient current measurement based on a time-of-flight (TOF) method. Specifically, its electron mobility and hole mobility at a field intensity of $5 \times 10^5$ V/cm were measured with a time-of-flight measuring apparatus (TOF-301 manufactured by OPTEL). As a result, the hole mobility $\mu_{HEML}$ of the emitting layer was $9.5 \times 10^{-6}$ cm²/Vs and the electron mobility $\mu_{EEML}$ of the emitting layer was $1.6 \times 10^{-5}$ cm²/Vs. As a result, a relationship of $\mu_{HEML}/\mu_{EEML} = 0.6$ was found to be satisfied.

Comparative Example 1

An organic light emitting device was produced by the same method as that of Example 1 except that in Example 1, Compound 14 shown below was used instead of Compound 3 as the host for the emitting layer.

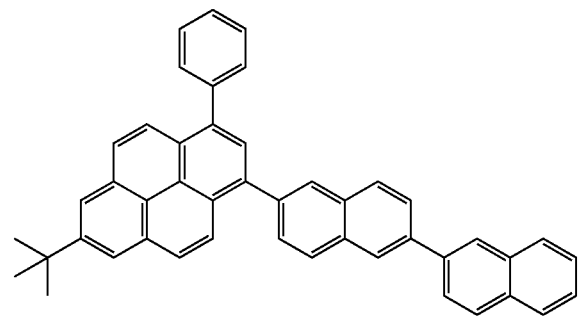

Compound 14

The resultant device was evaluated by the same method as that of Example 1. As a result, the device had CIE chromaticity coordinates (x, y) at a luminance of 1,000 cd/m² of (0.133, 0.151), and was observed to emit blue light derived from Compound 4. In addition, the device had a current efficiency at a luminance of 1,000 cd/m² of 8.4 cd/A, which was lower than that of Example 1. Further, the device had a luminance half time of 500 hours, which was shorter than that of Example 1.

Next, the emission wavelength region of the luminous dopant (emitting material) was measured in the same manner as in Example 1. As a result, the region was found to be 451 nm to 505 nm.

Next, the minimum triplet excitation energy of the host for the emitting layer was measured in the same manner as in Example 1. Prior to the measurement, the host and Compound 18 (triplet sensitizer) were simultaneously deposited from the vapor to form a thin film on a slide glass, thereby producing a sample for measurement. The minimum excited triplet energy of the host for the emitting layer was measured and calculated by using the sample for measurement. As a result, the energy was 1.83 eV. Therefore, in this comparative example, the material having the smallest minimum excited triplet energy in the emitting layer was found to be the host.

Figure 7:
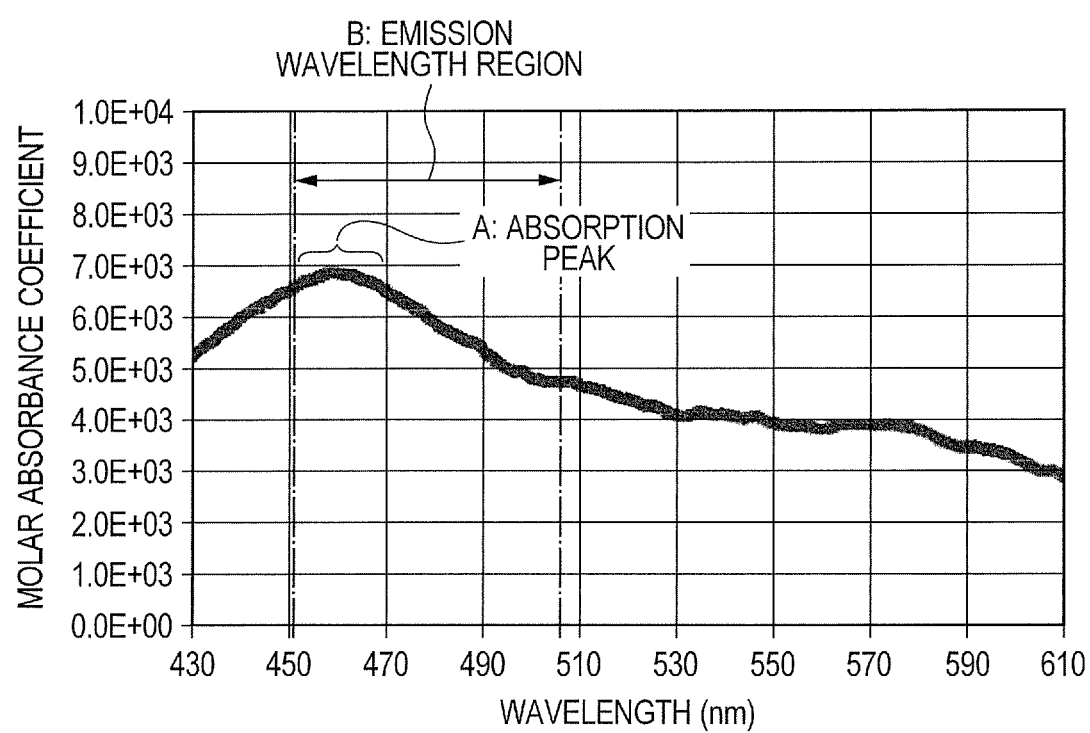
FIG. 7 shows the absorption spectrum of the minimum excited triplet state of Compound 14.

Next, an absorption spectrum in the minimum triplet excited state of the host was measured. As a result of the measurement, an absorption spectrum shown in FIG. 7 was obtained. It was found from FIG. 7 that an absorption peak A was present at about 459 nm and the absorption peak was present in the emission wavelength region (region B) of the emitting material. In consideration of the absorption spectrum, it is assumed that in the organic light emitting device of this comparative example, the transfer of energy from the emitting material (luminous dopant) in the minimum excited singlet state to the host in the minimum excited triplet state occurs to produce a host in a high-order excited triplet state. The foregoing is assumed to be responsible for the fact that the organic light emitting device of this comparative example is inferior in durability performance to the organic light emitting device of any one of Examples (such as Example 1).

Comparative Example 2

An organic light emitting device was produced by the same method as that of Example 1 except that in Example 1, Compound 7 shown below was used instead of Compound 3 as the host for the emitting layer.

Compound 7

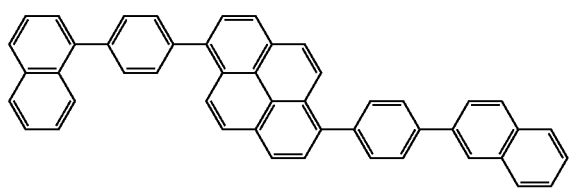

The resultant device was evaluated by the same method as that of Example 1. As a result, the device had CIE chromaticity coordinates (x, y) at a luminance of 1,000 cd/m² of (0.135, 0.148), and was observed to emit blue light derived from Compound 4. In addition, the device had a current efficiency at a luminance of 1,000 cd/m² of 7.8 cd/A, which was lower than that of Example 1. Further, the device had a luminance half time of 500 hours, which was shorter than that of Example 1.

In addition, in this comparative example, the $EL_H$ of the host was 3.19 eV and the $EL_D$ of the luminous dopant was 3.48 eV. Accordingly, a relationship of $EL_D$-$EL_H$=0.29 eV was satisfied and the requirement represented by the expression (I) was found to be satisfied.

Meanwhile, in this comparative example, the carrier mobility $\mu_H$ of the host alone was $6.8\times10^{-5}$ cm²/Vs.

On the other hand, the electron mobility and hole mobility of the emitting layer in this comparative example were measured in the same manner as in Example 1. As a result, the hole mobility $\mu_{HEML}$ of the emitting layer was $7.0\times10^{-5}$ cm²/Vs and the electron mobility $\mu_{EEML}$ of the emitting layer was $2.2\times10^{-4}$ cm²/Vs. As a result, a relationship of $\mu_{HEML}/\mu_{EEML}$=0.3 was found to be satisfied.

Example 2

Produced in this example was an organic light emitting device having an anode, a hole injection layer, a hole transporting layer, an emitting layer, a hole blocking layer, an electron transporting layer, and a cathode laminated in the stated order on a substrate. Here, parts of the materials used in this example are listed below.

Compound 8

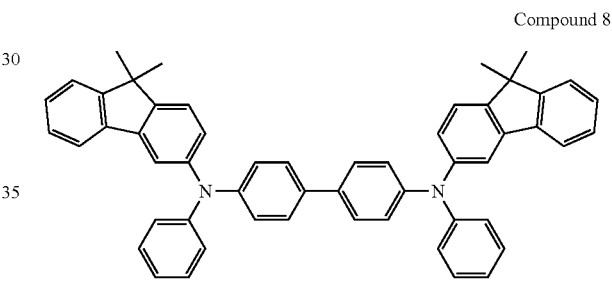

Compound 2

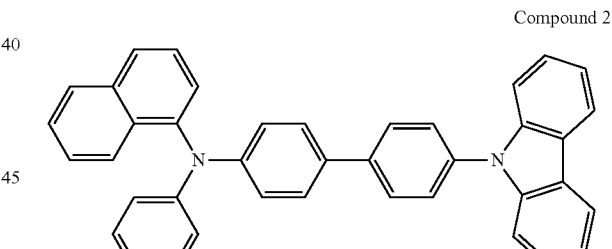

Compound 9

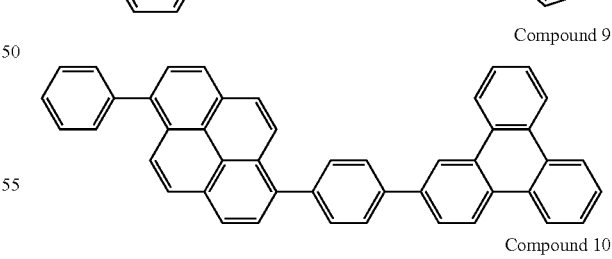

Compound 10

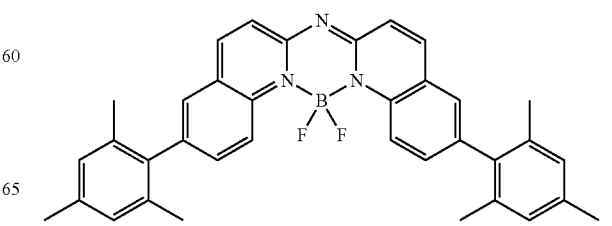

-continued

Compound 5

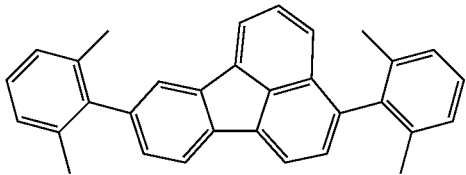

Compound 6

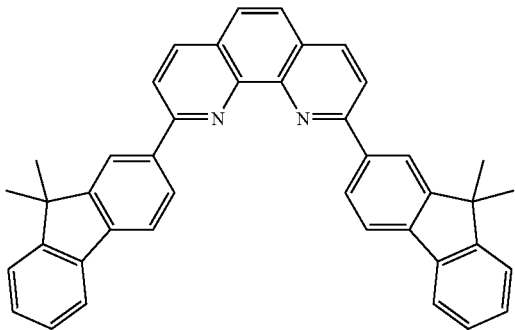

First, indium tin oxide (ITO) was formed into a film on a glass substrate (substrate) by a sputtering method to form the anode. At this time, the thickness of the anode was set to 100 nm. Next, the substrate on which the anode had been formed was subjected to ultrasonic cleaning with acetone and isopropyl alcohol (IPA) sequentially. Next, the cleaned product was subjected to cleaning by boiling with IPA, followed by drying. Further, the dried product was subjected to UV/ozone cleaning. The substrate treated by the method described above was used as a transparent conductive supporting substrate in a next step.

Next, organic compound layers and electrode layers shown in Table 1 below were sequentially formed on the anode by a vacuum deposition method.

TABLE 1

| | Material | Thickness [nm] |
|---|---|---|
| Hole injection layer | Compound 8 | 70 |
| Hole transporting layer | Compound 2 | 45 |
| Emitting layer | Host: Compound 9 (weight ratio: 99%) Luminous dopant: Compound 10 (weight ratio: 1%) | 25 |
| Hole blocking layer | Compound 5 | 5 |
| Electron transporting layer | Compound 6 | 30 |
| First metal electrode layer | LiF | 1 |
| Second metal electrode layer | Al | 100 |

Next, under a nitrogen atmosphere, the resultant device was covered with a protective glass plate and then sealed with an acrylic resin-based adhesive material so that the device did not deteriorate owing to its moisture adsorption. Thus, the organic light emitting device was obtained.

The device characteristics of the resultant device were measured and evaluated by the same method as that of Example 1. As a result, the device had CIE chromaticity coordinates (x, y) at a luminance of 1,000 cd/m$^2$ of (0.138, 0.122), and was observed to emit blue light derived from Compound 10. In addition, the device had a current efficiency at a luminance of 1,000 cd/m$^2$ of 9.3 cd/A. Further, when the device was continuously driven in a dry air atmosphere in a state where a current density was kept at 100 mA/cm$^2$, its luminance half time was 600 hours.

Next, $EL_H$ and $EL_D$ were evaluated by the same method as that of Example 1. As a result, the $EL_H$ was 3.14 eV and the $EL_D$ was 3.61 eV. Accordingly, a relationship of $EL_D$−$EL_H$=0.47 eV was satisfied and the requirement represented by the expression (I) was found to be satisfied.

Further, the hole mobility $\mu_H$ of the host (Compound 9) was evaluated by the same method as that of Example 1. As a result, the mobility was 2.6×10$^{-5}$ cm$^2$/Vs.

Next, the carrier mobilities of the emitting layer were measured by using Compound 9 and Compound 10 by the same method as that of Example 1. As a result, the hole mobility $\mu_{HEML}$ of the emitting layer was 2.8×10$^{-5}$ cm$^2$/Vs and the electron mobility $\mu_{EEML}$ of the emitting layer was 2.0×10$^{-7}$ cm$^2$/Vs. As a result, a relationship of $\mu_{HEML}/\mu_{EEML}$=140 was found to be satisfied.

Comparative Example 3

An organic light emitting device was produced by the same method as that of Example 2 except that in Example 2, Compound 7 shown below was used as the host in the emitting layer.

Compound 7

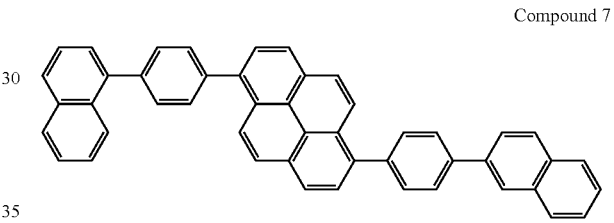

The device characteristics of the resultant device were measured and evaluated by the same method as that of Example 1. As a result, the device had CIE chromaticity coordinates (x, y) at a luminance of 1,000 cd/m$^2$ of (0.138, 0.122), and was observed to emit blue light derived from Compound 10. In addition, the device had a current efficiency at a luminance of 1,000 cd/m$^2$ of 7.6 cd/A, which was lower than that of Example 2. Further, when the device was continuously driven in a dry air atmosphere in a state where a current density was kept at 100 mA/cm$^2$, its luminance half time was 350 hours, which was shorter than that of Example 2.

Next, $EL_H$ and $EL_D$ were evaluated by the same method as that of Example 1. As a result, the $EL_H$ was 3.19 eV and the $EL_D$ was 3.61 eV. Accordingly, a relationship of $EL_D$−$EL_H$=0.42 eV was satisfied and the requirement represented by the expression (I) was found to be satisfied.

Further, the hole mobility $\mu_H$ of the host (Compound 7) was evaluated by the same method as that of Example 1. As a result, the mobility was 6.8×10$^{-5}$ cm$^2$/Vs.

Next, the carrier mobilities of the emitting layer were measured by using Compound 7 and Compound 10 by the same method as that of Example 1. As a result, the hole mobility $\mu_{HEML}$ of the emitting layer was 7.0×10$^{-5}$ cm$^2$/Vs and the electron mobility $\mu_{EEML}$ of the emitting layer was 2.1×10$^{-7}$ cm$^2$/Vs. As a result, a relationship of $\mu_{HEML}/\mu_{EEML}$=333 was found to be satisfied.

Example 3

Produced in this example was an organic light emitting device having an anode, a hole injection layer, a hole transporting layer, an emitting layer, a hole blocking layer, an electron transporting layer, and a cathode laminated in the stated order on a substrate. Here, parts of the materials used in this example are listed below.

Compound 1

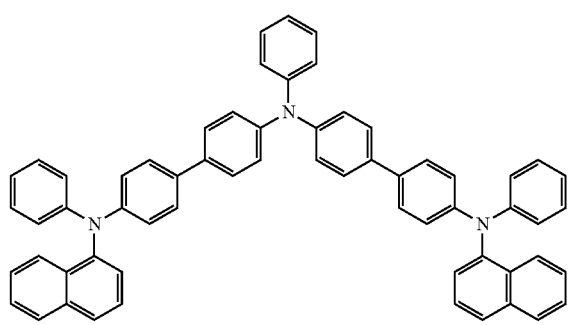

Compound 2

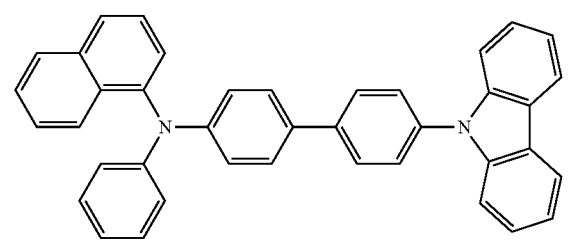

Compound 11

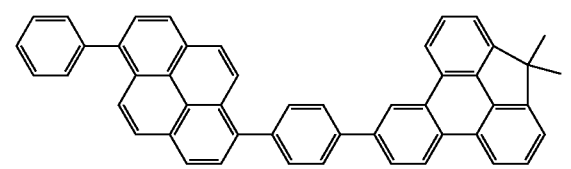

Compound 12

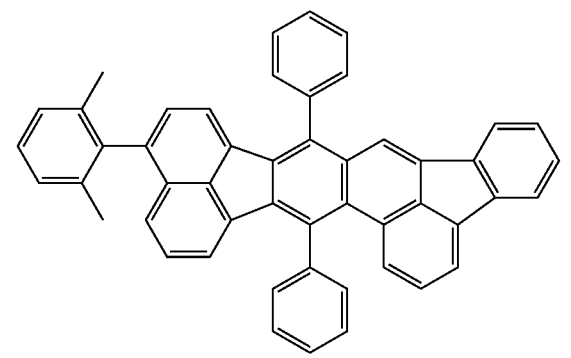

Compound 13

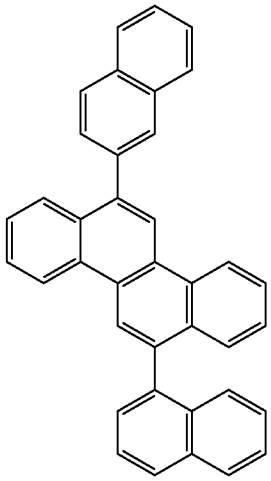

Compound 6

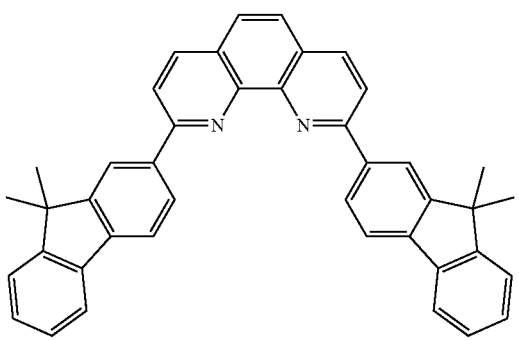

First, indium tin oxide (ITO) was formed into a film on a glass substrate (substrate) by a sputtering method to form the anode. At this time, the thickness of the anode was set to 100 nm. Next, the substrate on which the anode had been formed was subjected to ultrasonic cleaning with acetone and isopropyl alcohol (IPA) sequentially. Next, the cleaned product was subjected to cleaning by boiling with IPA, followed by drying. Further, the dried product was subjected to UV/ozone cleaning. The substrate treated by the method described above was used as a transparent conductive supporting substrate in a next step.

Next, organic compound layers and electrode layers shown in Table 2 below were sequentially formed on the anode by a vacuum deposition method.

TABLE 2

| | Material | Thickness [nm] |
|---|---|---|
| Hole injection layer | Compound 1 | 70 |
| Hole transporting layer | Compound 2 | 45 |
| Emitting layer | Host: Compound 11 (weight ratio: 99%) Luminous dopant: Compound 12 (weight ratio: 1%) | 25 |
| Hole blocking layer | Compound 13 | 5 |
| Electron transporting layer | Compound 6 | 30 |
| First metal electrode layer | LiF | 1 |
| Second metal electrode layer | Al | 100 |

Next, under a nitrogen atmosphere, the resultant device was covered with a protective glass plate and then sealed with an acrylic resin-based adhesive material so that the device did not deteriorate owing to its moisture adsorption. Thus, the organic light emitting device was obtained.

The device characteristics of the resultant device were measured and evaluated by the same method as that of Example 1. As a result, the device had CIE chromaticity coordinates (x, y) at a luminance of 1,000 cd/m² of (0.148, 0.144), and was observed to emit blue light derived from Compound 12. In addition, the device had a current efficiency at a luminance of 1,000 cd/m² of 8.0 cd/A. Further, when the device was continuously driven in a dry air atmosphere in a state where a current density was kept at 100 mA/cm², its luminance half time was 700 hours.

Next, $EL_H$ and $EL_D$ were evaluated by the same method as that of Example 1. As a result, the $EL_H$ was 3.04 eV and the $EL_D$ was 3.55 eV. Accordingly, a relationship of $EL_D-EL_H=0.51$ eV was satisfied and the requirement represented by the expression (I) was found to be satisfied.

Further, the hole mobility $\mu_H$ of the host (Compound 11) was evaluated by the same method as that of Example 1. As a result, the mobility was $8.7\times10^{-6}$ cm²/Vs.

Next, the carrier mobilities of the emitting layer were measured by using Compound 11 and Compound 12 by the same method as that of Example 1. As a result, the hole mobility $\mu_{HEML}$ of the emitting layer was $9.0\times10^{-6}$ cm²/Vs and the electron mobility $\mu_{EEML}$ of the emitting layer was $2.2\times10^{-6}$ cm²/Vs. As a result, a relationship of $\mu_{HEML}/\mu_{EEML}=4.0$ was found to be satisfied.

Comparative Example 4

An organic light emitting device was produced by the same method as that of Example 3 except that in Example 3, Compound 14 shown below was used as the host in the emitting layer.

Compound 14

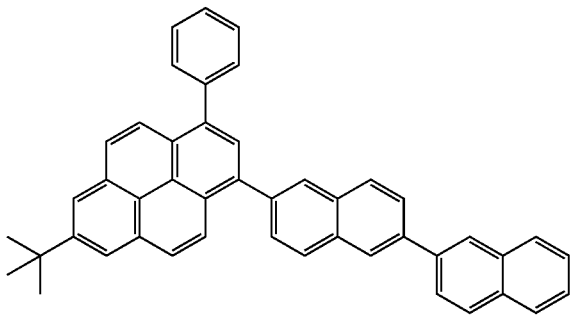

The device characteristics of the resultant device were measured and evaluated by the same method as that of Example 1. As a result, the device had CIE chromaticity coordinates (x, y) at a luminance of 1,000 cd/m² of (0.148, 0.144), and was observed to emit blue light derived from Compound 12. In addition, the device had a current efficiency at a luminance of 1,000 cd/m² of 7.5 cd/A, which was lower than that of Example 3. Further, when the device was continuously driven in a dry air atmosphere in a state where a current density was kept at 100 mA/cm², its luminance half time was 450 hours, which was shorter than that of Example 3.

Next, $EL_H$ and $EL_D$ were evaluated by the same method as that of Example 1. As a result, the $EL_H$ was 2.98 eV and the $EL_D$ was 3.55 eV. Accordingly, a relationship of $EL_D-EL_H=0.57$ eV was satisfied and the requirement represented by the expression (I) was found to be satisfied.

Further, the hole mobility $\mu_H$ of the host (Compound 14) was evaluated by the same method as that of Example 1. As a result, the mobility was $1.3\times10^{-4}$ cm²/Vs.

Next, the carrier mobilities of the emitting layer were measured by using Compound 14 and Compound 12 by the same method as that of Example 1. As a result, the hole mobility $\mu_{HEML}$ of the emitting layer was $1.2\times10^{-4}$ cm²/Vs and the electron mobility $\mu_{EEML}$ of the emitting layer was $2.1\times10^{-6}$ cm²/Vs. As a result, a relationship of $\mu_{HEML}/\mu_{EEML}=57$ was found to be satisfied.

(Result and Discussion)

The examples described in the foregoing have shown that the organic light emitting device of the present invention is an organic light emitting device capable of achieving compatibility between a long continuous driving lifetime and excellent emission efficiency.

According to one embodiment of the present invention, it is possible to provide the organic light emitting device having high emission efficiency and a long continuous driving lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-095550, filed Apr. 30, 2013, and No. 2014-002872, filed Jan. 10, 2014 which are hereby incorporated by reference herein in their entirety.

The invention claimed is:

1. An organic light emitting device comprising:
a first electrode;
second electrode; and
an emitting layer placed between the first electrode and the second electrode,
wherein the emitting layer contains an emitting material that emits fluorescence and a material having a smallest minimum excited triplet energy among constituent materials of the emitting layer;
wherein a maximum value of absorption spectrum of the material in a minimum excited triplet state exists in a region other than in an emission wavelength region of the emitting material, and
wherein the material comprises a compound represented by the following general formula (1) or (2):

[1]

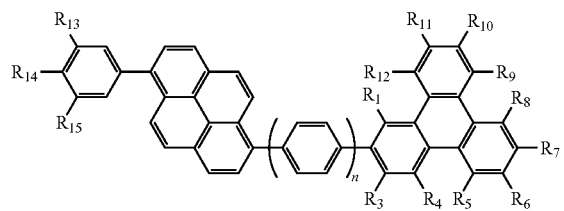

in the general formula (1), $R_1$ to $R_{15}$ each represent a hydrogen atom or a substituted or unsubstituted alkyl group, and n represents an integer of 0 or more and 2 or less,

[2]

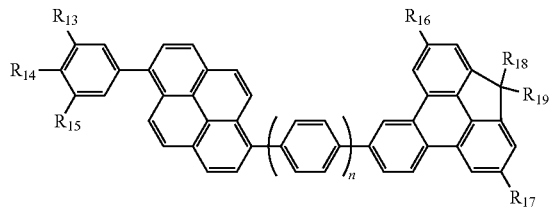

in the general formula (2), $R_{13}$ to $R_{17}$ each represent a hydrogen atom or a substituted or unsubstituted alkyl group, $R_{18}$ and $R_{19}$ each represent a substituted or unsubstituted alkyl group, and n represents an integer of 0 or more and 2 or less.

2. The organic light emitting device according to claim 1, wherein the emitting material comprises a material that emits blue light.

3. The organic light emitting device according to claim 1, wherein in the emission wavelength region of the emitting material, a molar absorbance coefficient in the minimum excited triplet state of the material having the smallest minimum excited triplet energy in the emitting layer is 6,500 [L/(mol·cm)] or less.

4. The organic light emitting device according to claim 1, wherein the material having the smallest minimum excited triplet energy comprises a host having a largest weight ratio among constituent materials of the emitting layer.

5. The organic light emitting device according to claim 1, further comprising:
a hole transporting layer in contact with the emitting layer; and
an electron transporting layer in contact with the emitting layer,
wherein minimum excited triplet energies of the hole transporting layer and the electron transporting layer are larger than the minimum excited triplet energy of the material having the smallest minimum excited triplet energy in the emitting layer.

6. The organic light emitting device according to claim 1, further comprising:
a hole transporting layer in contact with the emitting layer; and
an electron transporting layer in contact with the emitting layer,
wherein the emitting layer contains the material represented by formula (1) or (2) serving as a host and a luminous dopant;
the material has a hole mobility $\mu_H$ of $5\times10^{-5}$ cm$^2$/Vs or less; and
a relationship represented by the following expression (I) is satisfied:

$$EL_D - EL_H \geq 0.15 \text{ eV} \quad (I)$$

in the expression (I), $EL_D$ is a parameter derived from the following expression (Ia) and $EL_H$ is a parameter derived from the following expression (Ib):

$$EL_D = |Ip_D| - EG_D \quad (Ia)$$

$$EL_H = |Ip_H| - EG_H \quad (Ib)$$

in the expression (Ia), $Ip_D$ represents an ionization potential of the luminous dopant and $EG_D$ represents an energy gap of the luminous dopant; and
in the expression (Ib), $Ip_H$ represents an ionization potential of the material and $EG_H$ represents an energy gap of the material.

7. The organic light emitting device according to claim 1, wherein a relationship represented by the following expression (II) is satisfied:

$$0.1 \leq \{\mu_{HEML}/\mu_{EEmL}\} \leq 1{,}000 \quad (II)$$

in the expression (II), $\mu_{EEML}$ represents an electron mobility of the emitting layer containing the material and $\mu_{HEML}$ represents the hole mobility of the emitting layer containing the material.

8. The organic light emitting device according to claim 1, wherein the emitting layer contains multiple kinds of emitting materials;
at least one kind of the multiple kinds of emitting materials comprises an emitting material that emits light having a color different from that of any other emitting material; and
the organic light emitting device outputs white light to an outside.

9. A display apparatus comprising multiple pixels, wherein the display apparatus is configured to control light emission of each of the multiple pixels; and
at least one of the multiple pixels includes the organic light emitting device according to claim 1 and an active device connected to the organic light emitting device.

10. The display apparatus according to claim 9, wherein the active device comprises a transistor; and
the transistor includes an oxide semiconductor in a channel portion thereof.

11. A lighting apparatus comprising:
the organic light emitting device according to claim 1; and
an AC/DC converter circuit for supplying a driving voltage to the organic light emitting device.

12. An image forming apparatus comprising:
a photosensitive member;
a charging device for charging the photosensitive member;
an exposing device for exposing the photosensitive member to form an electrostatic latent image; and
a developing device for developing the electrostatic latent image formed on the photosensitive member,
wherein the exposing device includes the organic light emitting device according to claim 1.

13. An exposing unit for exposing a photosensitive member comprising an emitting point, wherein the emitting point includes the organic light emitting device according to claim 1 and an active device connected to the organic light emitting device.

14. The exposing unit according to claim 13, wherein the exposing unit includes a plurality of the emitting points; and
the emitting points are arrayed along a long axis direction of the photosensitive member.

15. An organic light emitting device comprising:
a first electrode;
second electrode; and
an organic compound layer placed between the first electrode and the second electrode, wherein the organic compound layer contains a compound represented by the following general formula (1) or (2):

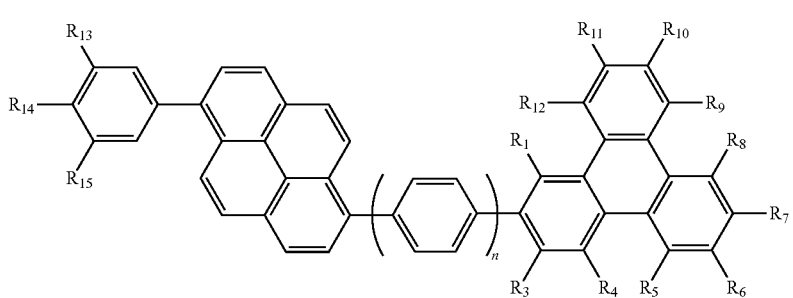

in the general formula (1), $R_1$ to $R_{15}$ each represent a hydrogen atom or a substituted or unsubstituted alkyl group, and n represents an integer of 0 or more and 2 or less;

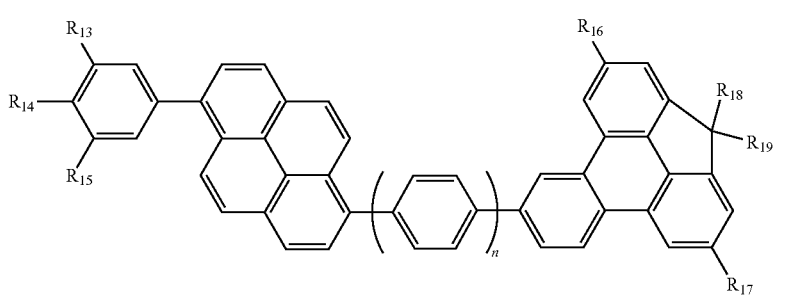

in the general formula (2), $R_{13}$ to $R_{17}$ each represent a hydrogen atom or a substituted or unsubstituted alkyl group, $R_{18}$ and $R_{19}$ each represent a substituted or unsubstituted alkyl group, and n represents an integer of 0 or more and 2 or less.

16. The organic light emitting device according to claim 15, wherein the organic compound layer includes a light emitting layer, and
  wherein the light emitting layer contains the compound represented by the general formula (1) or (2).

17. A display apparatus comprising multiple pixels, wherein the display apparatus is configured to control light emission of each of the multiple pixels; and
  at least one of the multiple pixels includes the organic light emitting device according to claim 15 and an active device connected to the organic light emitting device.

18. The display apparatus according to claim 15, wherein the active device comprises a transistor; and
  the transistor includes an oxide semiconductor in a channel portion thereof.

19. A lighting apparatus comprising:
  the organic light emitting device according to claim 15; and
  an AC/DC converter circuit for supplying a driving voltage to the organic light emitting device.

* * * * *